(12) United States Patent
Ong et al.

(10) Patent No.: US 8,908,428 B2
(45) Date of Patent: Dec. 9, 2014

(54) VOLTAGE ASSISTED STT-MRAM WRITING SCHEME

(71) Applicants: Adrian E. Ong, Pleasanton, CA (US); Vladimir Nikitin, Campbell, CA (US); Mohamad Towfik Krounbi, San Jose, CA (US)

(72) Inventors: Adrian E. Ong, Pleasanton, CA (US); Vladimir Nikitin, Campbell, CA (US); Mohamad Towfik Krounbi, San Jose, CA (US)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 13/753,350

(22) Filed: Jan. 29, 2013

(65) Prior Publication Data

US 2014/0211557 A1   Jul. 31, 2014

(51) Int. Cl.
  *G11C 11/14* (2006.01)
  *G11C 11/16* (2006.01)
  *H01L 43/02* (2006.01)
  *H01L 43/12* (2006.01)

(52) U.S. Cl.
  CPC ........ *G11C 11/1673* (2013.01); *G11C 11/1675* (2013.01); *H01L 43/02* (2013.01); *H01L 43/12* (2013.01)

USPC ........... 365/171; 365/158; 365/148; 365/173; 365/157; 365/225.5

(58) Field of Classification Search
  CPC ....... H01L 43/08; H01L 27/228; H01L 43/12; G11C 11/5607; G11C 11/16; G11C 19/0808; G11C 11/15
  USPC .................. 365/171, 158, 130, 148, 173, 157, 365/225.5, 243.5
  See application file for complete search history.

(56) References Cited

U.S. PATENT DOCUMENTS

2006/0227466 A1* 10/2006 Yagami ..................... 360/324.2

* cited by examiner

*Primary Examiner* — Thong Q Le
(74) *Attorney, Agent, or Firm* — Renaissance IP Law Group LLP

(57) ABSTRACT

An embodiment includes a three terminal magnetic element for a semiconductor memory device. The magnetic element includes a reference layer; a free layer; a barrier layer disposed between the reference layer and the free layer; a first electrode; an insulating layer disposed between the electrode and the free layer; and a second electrode coupled to sidewalls of the free layer.

36 Claims, 22 Drawing Sheets

VOLTAGE ASSISTED STT-MRAM WRITING SCHEME

BACKGROUND

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information-recording medium. One type of MRAM is a spin transfer torque random access memory (STT-RAM). STT-RAM utilizes magnetic elements written at least in part by a current driven through the magnetic element.

For example, a magnetic tunneling junction (MTJ) can be used in a conventional STT-RAM. The conventional MTJ is typically formed over a bottom contact, uses seed layer(s) and includes a pinning layer, e.g., an antiferromagnetic (AFM) layer, a pinned layer (or a reference layer), a tunneling barrier layer, a free layer, and a capping layer. A top contact is disposed to make an electrical connection to the free layer. The top and bottom contacts form a two terminal magnetic element that is coupled between control lines, such as a bit line and a source line and/or a selection transistor.

SUMMARY

An embodiment includes a magnetic element for a semiconductor device, comprising: a reference layer; a free layer; a barrier layer disposed between the reference layer and the free layer; a first electrode; an insulating layer disposed between the electrode and the free layer; and a second electrode coupled to sidewalls of the free layer.

Another embodiment includes a memory cell for a semiconductor device, comprising: a magnetic element including: a free layer; a first electrode coupled to sidewalls of the free layer; a second electrode; and a third electrode where the first electrode is substantially insulated from the third electrode; a bit line coupled to the first terminal; a source line coupled to the second terminal; and a voltage line coupled to the third terminal.

Another embodiment includes a method of writing data to a semiconductor device, comprising: applying a voltage between a voltage line and a bit line of a magnetic memory cell; and applying a voltage between a source line of the magnetic memory cell and the bit line.

Another embodiment includes a method of reading data from a semiconductor device, comprising: precharging a voltage line and a bit line associated with a memory cell to corresponding precharge voltages; applying a voltage between a source line associated with the memory cell and the bit line; and sensing a current through the memory cell.

Another embodiment includes a method, comprising: sequentially forming a magnetic element including a free layer, a first insulating layer, and a first electrode; forming a second insulating layer on side surfaces of the first electrode; and forming a second electrode coupled to the free layer after forming the second insulating layer on the side surfaces of the first electrode.

DETAILED DESCRIPTION

Figure 1:
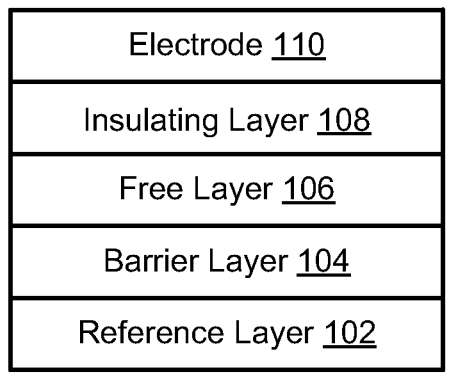
FIG. 1 is a cross-section view of a magnetic element according to an embodiment.

The embodiments relate to magnetic elements usable in magnetic devices, such as magnetic memories, the devices using such magnetic elements and techniques of forming such magnetic elements. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations.

However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic elements and magnetic memories having certain components. One of ordinary skill in the art will readily recognize that the present invention is consistent with the use of magnetic elements and magnetic memories having other and/or additional components and/or other features not inconsistent with the present invention. One of ordinary skill in the art will also readily recognize that the method and system are described in the context of a structure having a particular relationship to a substrate. However, one of ordinary skill in the art will readily recognize that the method and system are consistent with other structures. In addition, one of ordinary skill in the art will readily recognize that the layers could have another structure. Furthermore, the method and system are described in the context of magnetic elements having particular layers. However, one of ordinary skill in the art will readily recognize that magnetic elements having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single elements. However, one of ordinary skill in the art will readily recognize that the method and system are consistent with the use of magnetic memories having multiple elements.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

FIG. 1 is a cross-section view of a magnetic element according to an embodiment. In this embodiment, a magnetic element 100 includes a reference layer 102, a free layer 106, a barrier layer 104 disposed between the reference layer 102 and the free layer 106, an electrode 110, and an insulating layer 108 disposed between the electrode 110 and the free layer 106

The reference layer 102, or pinned layer, can be a ferromagnetic layer. For example, the reference layer 102 can include Co, Fe, Ni, alloys of such materials, or the like. Although not illustrated other layers to pin the magnetization of the reference layer 102, such as antiferromagnetic layers, can be present as desired. The free layer 106 can be a ferromagnetic layer similar to the reference layer 102; however, the free layer 106 can be configured such that the magnetization direction can be switched.

The barrier layer 104 can be a layer having a thickness that allows for tunneling of electrons through the barrier layer 104. For example, the barrier layer 104 can include $Al_2O_3$, MgO, AlN, $Ta_2O_5$, $SiO_2$, $HfO_2$, $ZrO_2$, $MgF_2$, $CaF_2$, or the like.

The insulating layer 108 is configured to substantially insulate a connection between the electrode 110 and the free layer 106. Any material that can act as an insulator can be used as the insulating layer 108. The insulating layer 108 can be MgO, $SiO_2$, materials similar to the barrier layer 104, or any other insulating material that can be deposited and be substantially free of defects, such as pinholes or other sources of leakage current. For example, while MgO can be used as the barrier layer 104 and can be conductive at a particular thickness, at a greater thickness, MgO can be used as the insulating layer 108. In some embodiments, a thickness of the insulating layer 108 may be between about 1 to about 100 nm. In other embodiments, a thickness of the insulating layer may be between about 1 to about 10 nm.

In an embodiment, a thickness of the insulating layer 108 may be selected based on a desired applied electric field. For example, if a desired electric field is from about 0.01 to 0.1 V/nm and a voltage to be used is from about 0.1 to 1 V, a thickness of the insulating layer 108 may be about 10 nm.

The electrode 110 may be formed of any conductive material. For example, the electrode 110 can be Ta, Ti, W, Al, or other similar material. In some embodiments, materials that have relatively lower work functions may be used. As will be described in further detail below, in some embodiments, a material that oxidizes more readily than materials used for the free layer 106, barrier layer 104, or the like may be used.

As will be described in further detail below, an electric field can be applied to the free layer 106 using the electrode 110. The electric field can change the magnetic coercivity of the magnetic element 100. As a result, writing operations can use less current and/or have a lower error rate, and reading operations can have a reduced chance of a spurious change in state while reading.

Figure 2:
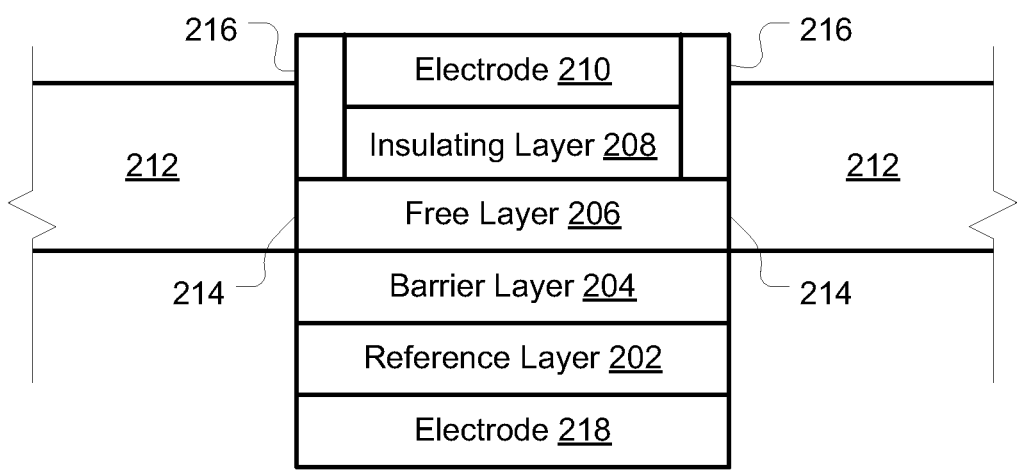
FIG. 2 is a cross-section view illustrating a connection to a layer of a magnetic element according to an embodiment.

FIG. 2 is a cross-section view illustrating a connection to a layer of a magnetic element according to an embodiment. In this embodiment, the magnetic element 200 includes a reference layer 202, barrier layer 204, free layer 206, insulating layer 208, and electrode 210 are similar to reference layer 102, barrier layer 104, free layer 106, insulating layer 108, and electrode 110. In an embodiment, the electrode 210 may be formed of a conductive material that can be oxidized to form a substantial oxide capping layer as shown in, for example, FIG. 26, while the free layer 206 is largely inert. In other words, top and side portions of the electrode 210 can be sufficiently oxidized to form an oxide capping layer 2452 covering the top and side surfaces of the electrode 210 while the free layer 206 is not substantially oxidized such that the electrode 212 can be electrically coupled thereto as will be explained in further detail below. As a result, the free layer 206 (and the insulating layer 208) may retain the desired properties after forming the oxide capping layer 2452.

The magnetic element 200 includes an electrode 212. The electrode 212 can be a conductive material similar to the electrode 210; however, the electrode 210 and electrode 212 need not be the same material.

The electrode 212 is coupled to the free layer 206. In this embodiment, the electrode 212 is coupled to sidewalls 214 of the free layer 206. The electrode 212 is electrically coupled to the free layer 206.

However, an insulating layer 216 is disposed on sidewalls of the electrode 210. The insulating layer 216 can also be disposed on sidewalls of the insulating layer 208. The insulating layer 216 exposes at least a part of the free layer 206. That is, the insulating layer 216 does not cover at least a part of the free layer 206. In this embodiment, the insulating layer 216 exposes the sidewalls 214 of the free layer 206. As a result the electrode 212 is substantially insulated from the electrode 210. Accordingly, an electric field can be applied to the free layer 206 by applying a voltage between the electrode 210 and the electrode 212. As a result, the magnetic coercivity of the magnetic element 200 can be changed.

The magnetic element 200 can also include a third electrode 218. The third electrode is coupled to the reference layer 202. Although the third electrode 218 is illustrated as directly coupled to the reference layer 202, other intervening layers can be disposed between the third electrode 218 the reference layer 202.

Figure 3:
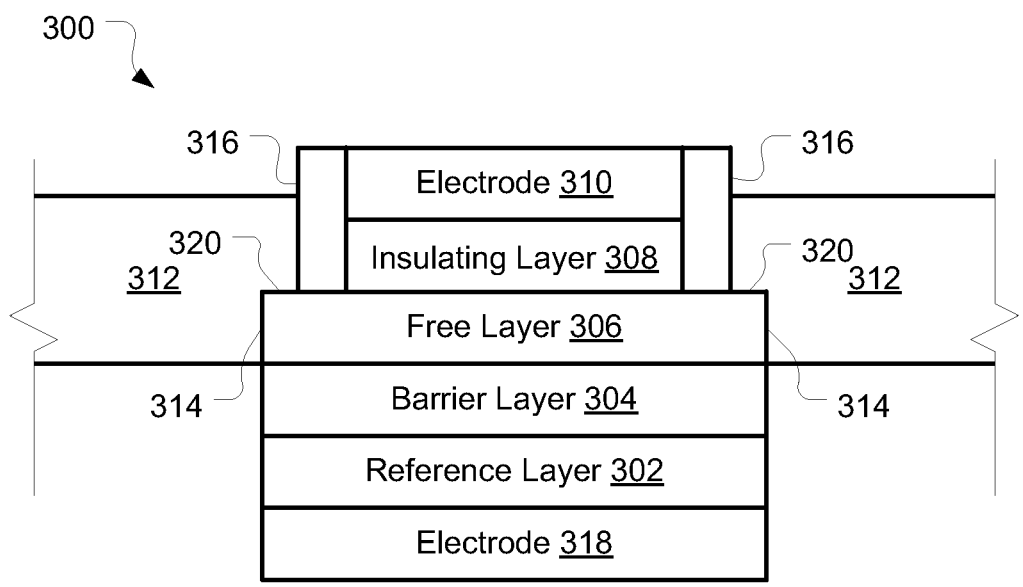
FIG. 3 is a cross-section view illustrating a connection to a layer of a magnetic element according to another embodiment.

FIG. 3 is a cross-section view illustrating a connection to a layer of a magnetic element according to another embodiment. In this embodiment, the magnetic element 300 includes a reference layer 302, barrier layer 304, free layer 306, insulating layer 308, electrode 310, electrode 312, sidewalls 314, and electrode 318 similar to the reference layer 202, barrier layer 204, free layer 206, insulating layer 208, electrode 210, electrode 212, sidewalls 214, and electrode 218.

In this embodiment, the electrode 312 is coupled to a top surface 320 of the free layer 306. For example, the electrode 310, insulating layer 308, and insulating layer 316 can have a dimension that is less than a corresponding dimension of the free layer 306. As a result, the top surface 320 can be exposed by the insulating layer 316. The electrode 312 can be formed on the exposed top surface 320.

In the present application, some features of one of embodiments of the present application may also be employed in the other embodiments. For example, as the electrode 312 can also be formed on the exposed top surface 320 to be coupled thereto as shown in FIG. 3, a portion of the top surface of the free layer in the other embodiments can also be exposed such that the electrode or bit lines can contact the portion of the top surface of the free layer.

Figure 4:
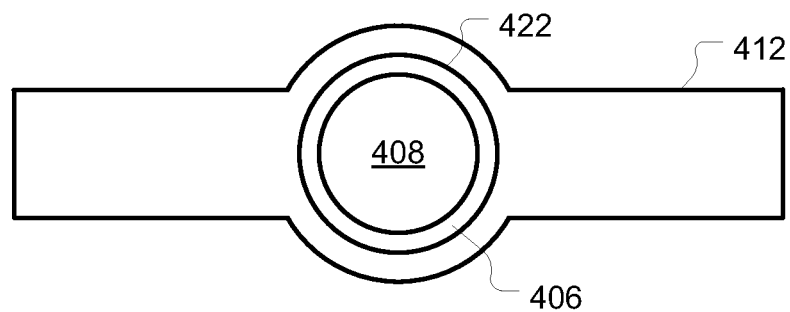
FIG. 4 is a two-dimensional top view illustrating an electrode coupled to a magnetic element according to an embodiment.

FIG. 4 is a two-dimensional top view illustrating an electrode coupled to a magnetic element according to an embodiment. In this embodiment, the electrode 412 can be similar to the electrodes 212 and/or 312 described above. The electrode 412 includes an opening 422. Although illustrated as a circular opening, the opening 422 can take any shape.

The insulating layer 408 can be similar to the insulating layers 208 and/or 308 described above. The insulating layer 408 is disposed in the opening 422. Accordingly, a portion of the free layer 406 is exposed. Here, an insulating layer similar to the insulating layers 216 and/or 316 is not shown for clarity; however, such an insulating layer can be disposed between the insulating layer 408 and an edge of the opening 422.

Figure 5:
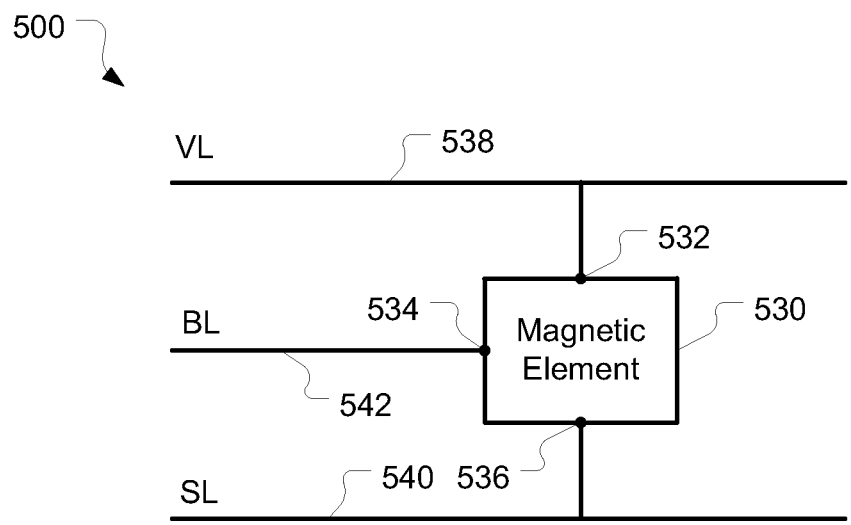
FIG. 5 is a schematic illustrating a memory cell with a magnetic element according to an embodiment.

FIG. 5 is a schematic illustrating a memory cell with a magnetic element according to an embodiment. In this embodiment, the memory cell 500 includes a magnetic element 530. The magnetic element 530 includes three electrodes 532, 534, and 536. The electrode 532 can be an electrode of the magnetic element 530. Electrode 534 is coupled to a free layer of the magnetic element 530. Electrode 536 is another electrode of the magnetic element 530.

The magnetic element 200 of FIG. 2 described above will be used as an example of the magnetic element 530. Referring to FIGS. 2 and 5, the electrode 532 is the electrode 210, the electrode 534 is the electrode 212, and the electrode 536 is the electrode 218. Although the electrodes 532, 534, and 536 have been described with respect to particular layers, the electrodes 532, 534, and 536 can be coupled to other layers that are electrically connected to the electrode 210, electrode 212, and electrode 218, respectively.

The memory cell 500 includes a bit line 542 coupled to electrode 534, a source line 540 coupled to electrode 536, and a voltage line 538 coupled to electrode 532. The voltage line 538 is coupled to the insulating layer 208 through electrode 536. Accordingly, a voltage between the voltage line 538 and the bit line 542 can be used in creating an electric field in the free layer 206.

The bit line 542 is coupled to the free layer 206 of the magnetic element 530 through the electrode 534. In an embodiment, the electrode 212 can form part of the bit line 542.

The source line 540 is coupled to the electrode 218 through electrode 536. Accordingly, the magnetic element 530 can be accessed using the voltage line 538, bit line 542, and source line 540.

Figure 6:
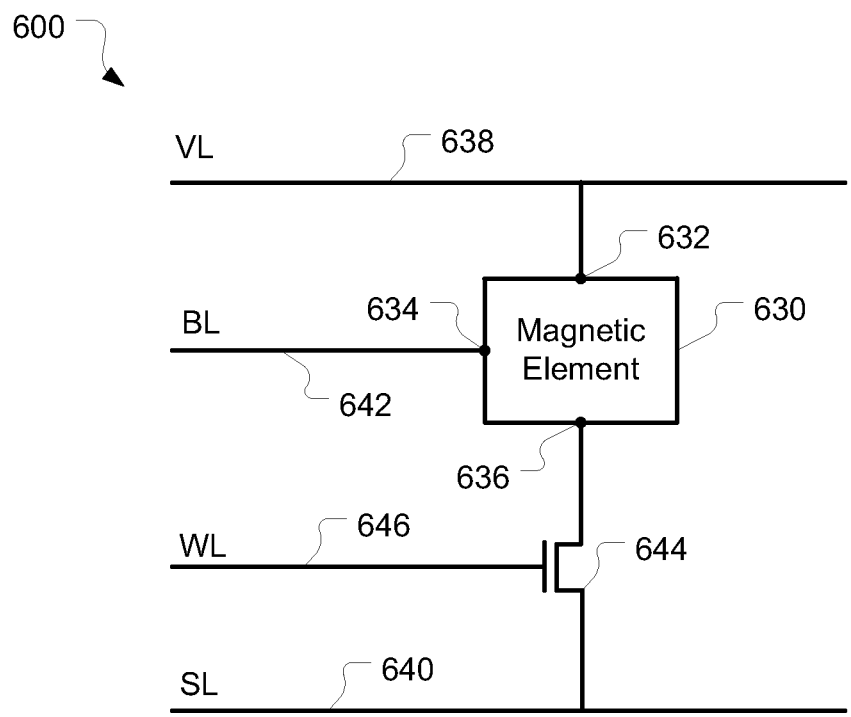
FIG. 6 is a schematic illustrating a memory cell with a magnetic element according to another embodiment.

FIG. 6 is a schematic illustrating a memory cell with a magnetic element according to another embodiment. In this embodiment, the magnetic element 630, electrode 632, electrode 634, electrode 636, source line 640, and bit line 642 are similar to the magnetic element 530, electrode 532, electrode 534, electrode 536, source line 540, and bit line 542 described above.

However, in this embodiment, a switching device 644, such as a transistor, is coupled between the source line 640 and the electrode 636. A word line 646 is coupled to the switching device 644. The switching device 644 is responsive to a signal on the word line 646.

Although voltage lines, bit lines, and source lines have been described above as being coupled to corresponding electrodes of the magnetic elements 530 and 630, the electrodes may form part of the corresponding voltage lines, bit lines, and source lines. Using a bit line as an example, the electrode 412 of FIG. 4 can be the portion of the corresponding bit line. Thus, the bit line act as the electrode for the free layer for each magnetic element to which it is coupled.

FIGS. 7-11 are cross-sectional block diagrams illustrating connections to a magnetic element according to various embodiments.

Figure 7:
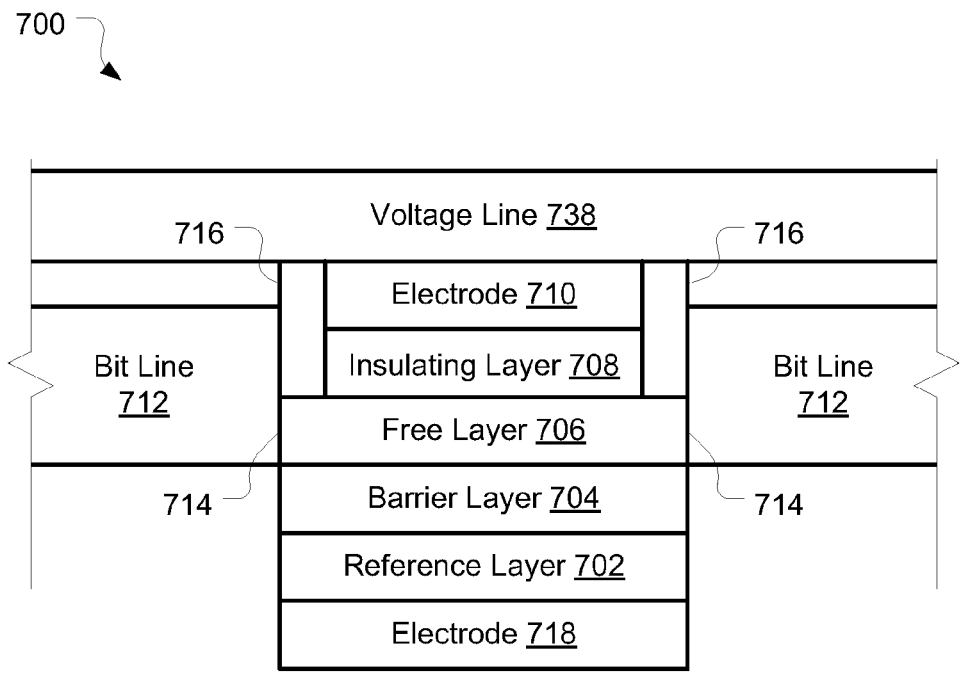
FIGS. 7-11 are cross-sectional block diagrams illustrating connections to a magnetic element according to various embodiments.

In the embodiment illustrated in FIG. 7, the magnetic element 700 includes a reference layer 702, barrier layer 704, free layer 706 having sidewalls 714, insulating layer 708, electrode 710, and electrode 718 similar to the reference layer 202, barrier layer 204, free layer 206 having, sidewalls 214, insulating layer 208, electrode 210, and electrode 218. Here, the bit line 712 acts as the electrode 212. As the bit line 712 can be coupled to multiple magnetic elements, the bit line 712 can act as the electrode for each of those magnetic elements. Thus, a separate electrode can, but need not be used. A voltage line 738 may be formed on the electrode 710. Here, the voltage line 738 extends substantially perpendicular to the bit line 712.

Figure 8:
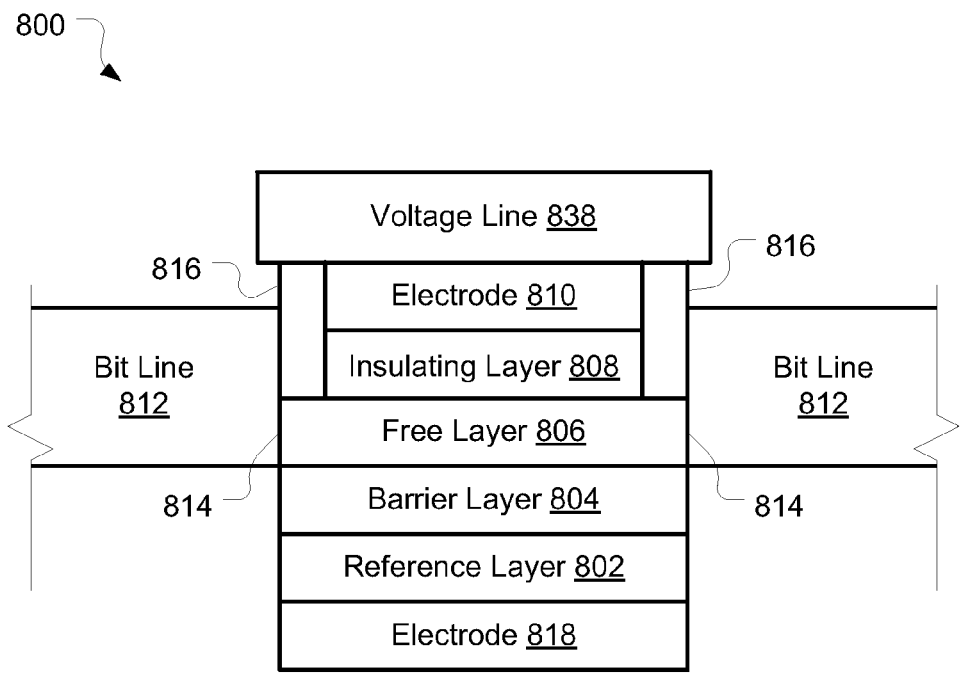

In the embodiment illustrated in FIG. 8, the magnetic element 800 includes a reference layer 802, barrier layer 804, free layer 806 having sidewalls 814, insulating layer 808, electrode 810, bit line 812, electrode 818, and voltage line 838 similar to the reference layer 702, barrier layer 704, free layer 706 having sidewalls 714, insulating layer 708, electrode 710, bit line 712, electrode 718, and voltage line 738. Here, the voltage line 838 extends substantially perpendicular to the bit line 812.

Figure 9:
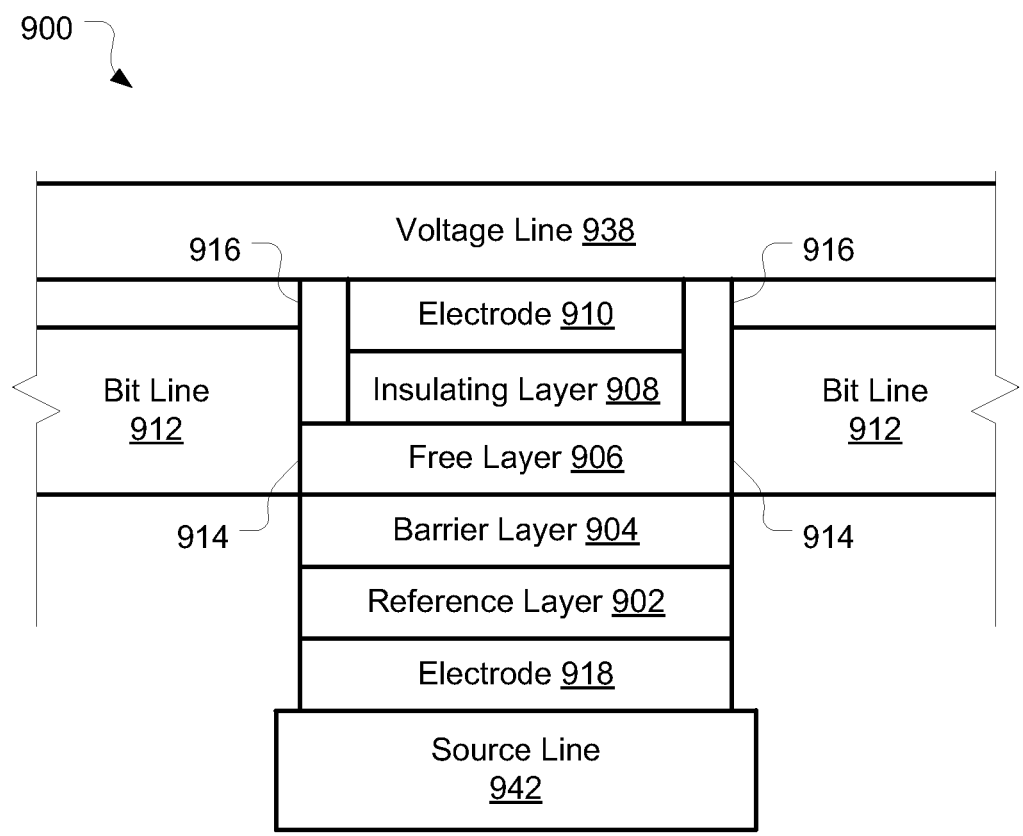

In the embodiment illustrated in FIG. 9, the magnetic element 900 includes a reference layer 902, barrier layer 904, free layer 906 having sidewalls 914, insulating layer 908, electrode 910, bit line 912, electrode 918, and voltage line 938 similar to the reference layer 702, barrier layer 704, free layer 706 having sidewalls 714, insulating layer 708, electrode 710, bit line 712, electrode 718, and voltage line 738.

In this embodiment, the electrode 918 is coupled to a source line 942. The source line 942 extends substantially perpendicular to the bit line 912 and voltage line 938.

Figure 10:
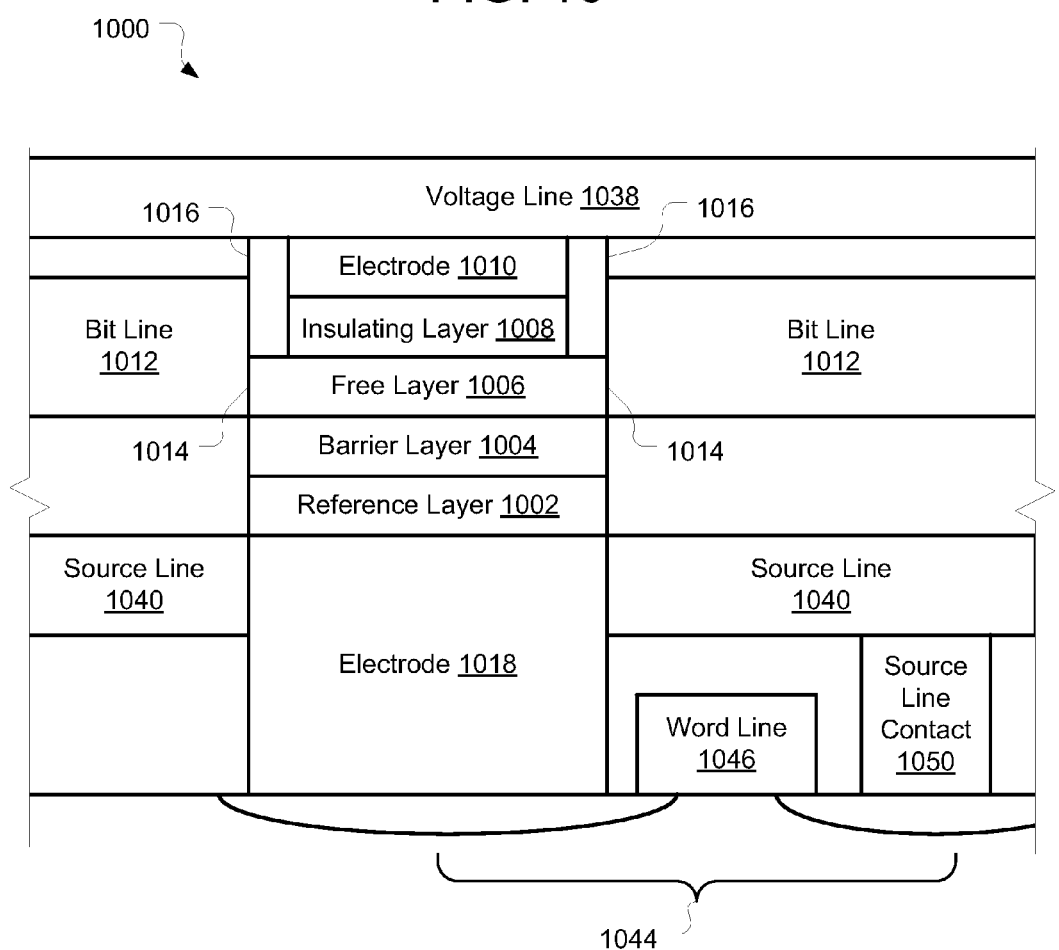

In the embodiment illustrated in FIG. 10, the magnetic element 1000 includes a reference layer 1002, barrier layer 1004, free layer 1006 having sidewalls 1014, insulating layer 1008, electrode 1010, bit line 1012, electrode 1018, and voltage line 1038 similar to the reference layer 702, barrier layer 704, free layer 706 having sidewalls 714, insulating layer 708, electrode 710, bit line 712, electrode 718, and voltage line 738. Here, the electrode 1018 extends to the transistor 1044. A word line 1046 may be coupled to the gate of the transistor 1044. A source line contact 1050 coupled the source line 1040 to the transistor 1044. Although the source line 1040 and the electrode 1018 are illustrated as being in the same plane, the source line 1040 and electrode 1018 are insulated from one another so that the transistor 1044 can selectively couple the source line 1040 and electrode 1018 in response to a signal on the word line 1046.

Figure 11:
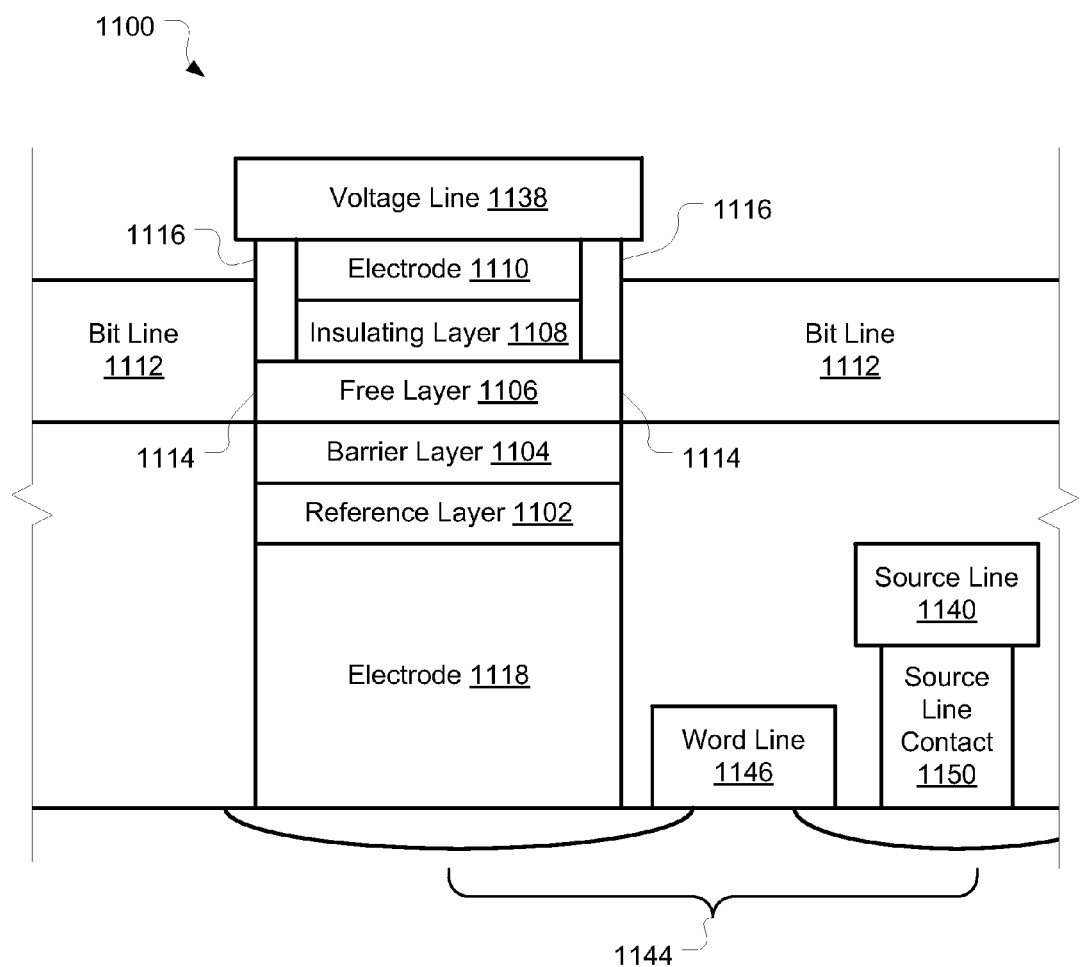

In the embodiment illustrated in FIG. 11, the magnetic element 1100 includes a reference layer 1102, barrier layer 1104, free layer 1106, insulating layer 1108, electrode 1110, bit line 1112, sidewalls 1114, electrode 1118, voltage line 1138, source line 1140, transistor 1144 word line 1146, and source line contact 1150 similar to the reference layer 1002, barrier layer 1004, free layer 1006, insulating layer 1008, electrode 1010, bit line 1012, sidewalls 1014, electrode 1018, voltage line 1038, source line 1040, transistor 1044 word line 1046, and source line contact 1050. Here the voltage line 1138 and source line 1140 are substantially perpendicular to the bit line 1112.

Although the above embodiments of connections to a magnetic element have used the structure of FIG. 2 as an example, similar connections can be made to other magnetic elements. For example, similar connections can be made to the magnetic element of FIG. 3, or other similar magnetic elements.

Figure 12:
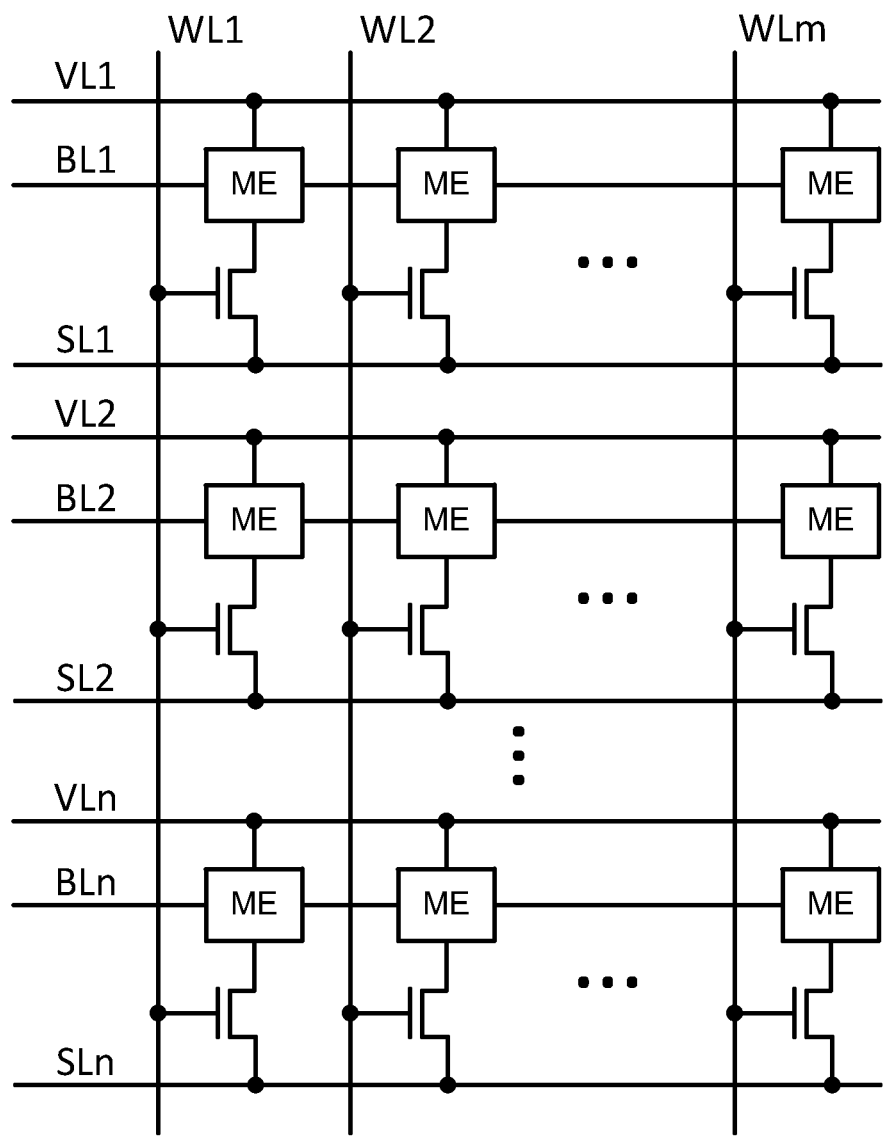
FIG. 12 is a schematic diagram illustrating a memory cell array with magnetic elements according to an embodiment.

FIG. 12 is a schematic diagram illustrating a memory cell array with magnetic elements according to an embodiment. In this embodiment, the magnetic elements ME are similar to the magnetic element 600 of FIG. 6, described above. Referring to FIGS. 6 and 12, the magnetic elements ME are disposed in an array. Each magnetic element ME is coupled to a corresponding one of the voltage lines VL1 through VLn, bit lines BL1 through BLn, and source lines SL 1 through SLn. The magnetic elements ME are each coupled to the corresponding source line SL through a corresponding switching device 644. The word lines WL1 through WLm are coupled to the switching devices 644 of the corresponding magnetic elements ME.

Figure 13:
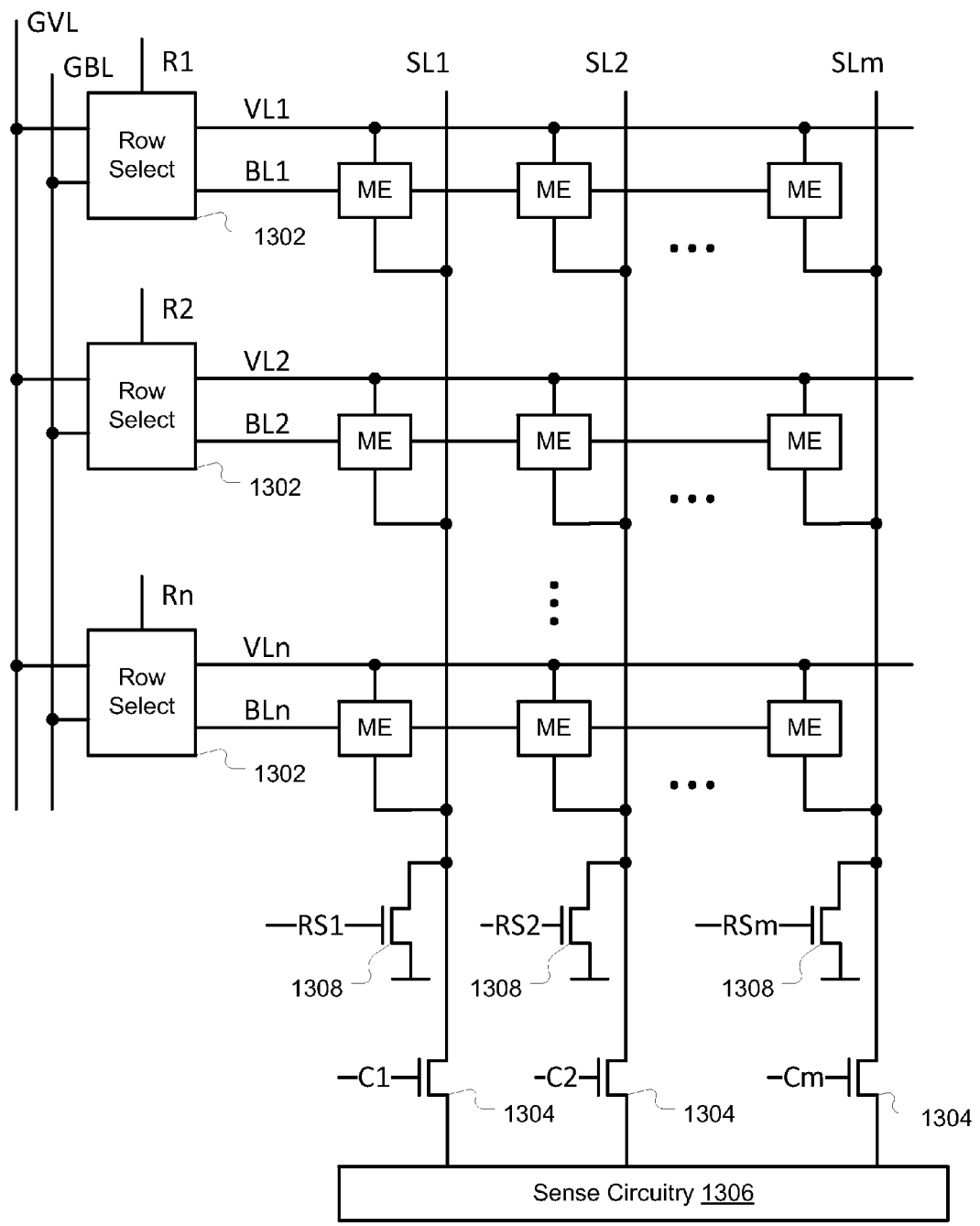
FIG. 13 is a schematic diagram illustrating a memory cell array with magnetic elements according to another embodiment.

FIG. 13 is a schematic diagram illustrating a memory cell array with magnetic elements according to another embodiment. In this embodiment, memory cells similar to memory cell 500 of FIG. 5 are disposed in an array. Referring to FIGS. 5 and 13, each memory element is coupled to corresponding lines of voltage lines VL1 through VLn, bit lines BL1 through BLn, and source lines SL1 through SLm.

Row selection circuits 1302 are disposed between a global voltage line GVL and a global bit line GBL and corresponding pairs of voltage lines VL and bit lines BL. The row selection circuits 1302 are configured to be responsive to row selection signals R1 through Rn. When selected, a row selection circuit 1302 is configured to couple the global voltage line GVL and the global bit line GBL to the selected voltage line VL and bit line BL, respectively. In an embodiment, the row selection circuits 1302 can include selection transistors coupled between the global voltage line GVL and the global bit line GBL and the corresponding voltage line VL and bit line BL, respectively.

Column selection transistors 1304 are disposed between the source lines SL and sense circuitry 1306. The column selection transistors 1304 are each responsive to corresponding column selection signals C1 through Cm. The sense circuitry 1306 can include current mirrors, enable circuits, sense amplifiers, or the like to sense a state of the magnetization of the memory cells.

Read shunt transistors 1308 are coupled between each of the source lines SL and a voltage source. The voltage source can be a ground, Vbb, or the like. In an embodiment, the voltage source has a potential substantially similar to a corresponding potential of the sense circuitry. For example, the sense circuitry 1306 can include a current mirror that when reading, is coupled between a selected source line SL and ground. Accordingly, the read shunt transistors 1308 can be coupled between ground and the corresponding source lines SL.

The shunt transistors 1308 are responsive to column read shunt signals RS1 through RSm. In an embodiment, the read shunt signals RS are disabled during a write cycle. During a read cycle, the read shunt signals RS are enabled for shunt transistors 1308 when the corresponding source lines SL are coupled to memory elements ME that are not being read. The column read shunt signal RS coupled to a source line SL associated with a memory element ME being read is disabled. Thus, the corresponding read isolation transistor 1308 is disabled. As will be described in further detail below, precharge transistors responsive to a precharge signal may also be coupled to the source lines SL. However, such a precharge signal and the column read shunt signals RS will be enabled at different times.

Accordingly, leakage current through unselected memory elements ME can be reduced if not substantially eliminated. Although current may flow through unselected memory elements ME coupled to a selected bit line BL, the current flows through the read pre-charge transistor 1308 coupled to the unselected source line SL. That is, the current does not substantially leak from the unselected source line SL through additional memory elements ME to the selected source line SL. As a result, the leakage current has a reduced impact on the sensed current.

Although the arrays of FIGS. 12 and 13 have been described as two dimensional arrays, the arrays can also be three dimensional arrays of magnetic elements ME with corresponding voltage lines VL, bit lines BL, and source lines SL. Moreover, with appropriate routing circuitry, the arrays of FIG. 12 or 13 could be disposed in banks of a hierarchical configuration.

Figure 14:
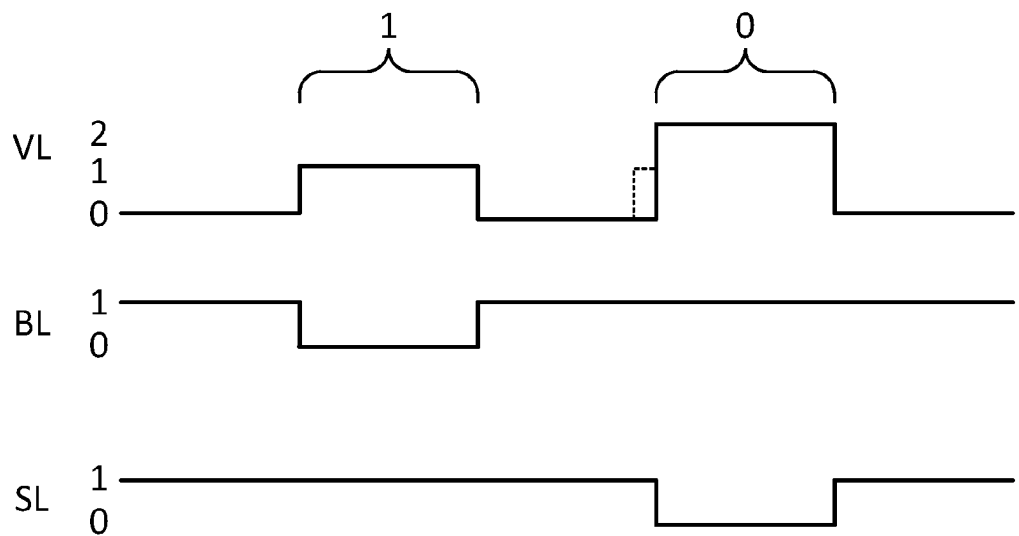
FIG. 14 is a timing diagram illustrating writing to a magnetic element according to an embodiment.

FIG. 14 is a timing diagram illustrating writing to a magnetic element according to an embodiment. The memory cell 500 of FIG. 5 is used as an example for reference. Referring to FIGS. 5 and 9, in this embodiment, for writing a 1, a voltage line VL is set to 1 V, a bit line BL is set to 0 V, and a source line SL is set to 1 V. As a result, a voltage is applied between both the voltage line VL and the bit line BL and between the bit line BL and the source line SL. Here, a voltage of 1 V is applied between the voltage line VL and the bit line BL and a voltage of −1 V between the bit line BL and the source line SL.

For writing a 0, the voltage line VL is set to 2 V, the bit line BL is set to 1 V, and the source line SL is set to 0 V. The different voltage on the voltage line VL still results in a voltage of 1 V applied between the voltage line VL and the bit line BL. A voltage of 1 V is applied between the bit line BL and the source line SL. In other words, a positive voltage is applied between the voltage line VL and the bit line BL when writing either a 1 or 0 while the voltage between the bit line BL and the source line SL changes polarity based on the data to be written.

As described above, when a voltage is applied to the voltage line VL, an electric field can be generated in the free layer of the magnetic element ME. With an electric field of a first polarity, the magnetic coercivity can be decreased. The voltage of 1 V that is between the voltage line VL and the bit line BL reduces the coercivity when writing either a 1 or 0. Thus, an amount of current required to write to the magnetic element ME can be reduced.

In an embodiment, the charging of the voltage line VL to 2 V can be performed in stages. For example, as illustrated by the dashed line when writing a 0, the voltage line VL can be charged first to 1 V, and then charged to 2 V. The charging to 1 V can be performed using an external power source while the subsequent charging to 2 V can be performed using an internal, boosted power source. Accordingly, an impact of the conversion efficiency when generating the boosted power source can be reduced.

Although 0 V, 1 V, and 2 V have been used as examples, the voltages can be different. For example, in an embodiment, the voltages can be Vbb, ground, Vdd, Vpp, or the like. Regardless of the particular voltage, the applied electric field can reduce a current used to write to the magnetic element ME. Moreover, although a single voltage difference of 1 V is described as being between the voltage line VL and the bit line BL when writing a 1 or 0, the voltage difference can be a different magnitude and can also be different for each state while being great enough in magnitude to achieve a desired level of reduction in the magnetic coercivity.

In addition, although a 1 and a 0 are described as the states of data to be written, the designation of the states can be different.

Figure 15:
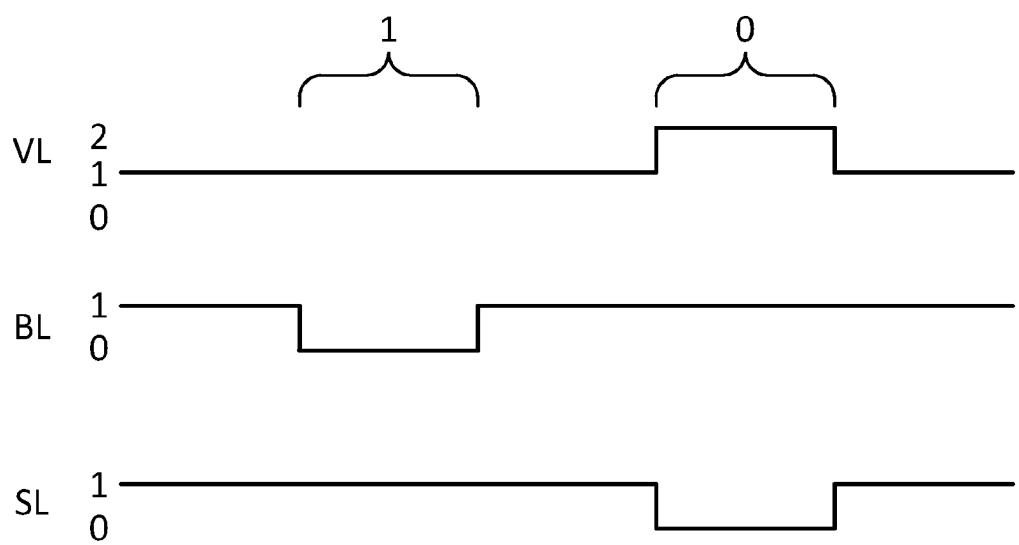
FIG. 15 is a timing diagram illustrating writing to a magnetic element according to another embodiment.

FIG. 15 is a timing diagram illustrating writing to a magnetic element according to another embodiment. The memory cell 500 of FIG. 5 is again used as an example for reference. Referring to FIGS. 5 and 10, the voltage line VL, bit line BL, and source line SL can be precharged to corresponding precharge voltages. In this embodiment, the voltage line VL, bit line BL, and source line SL are precharged to 1 V. However, in other embodiments, one or more of the voltage line VL, bit line BL, and source line SL can be precharged to different voltage.

In this embodiment, when writing a 1, the bit line BL is discharged to 0 V. Since the source line SL and voltage line VL were precharged to 1 V, the discharging of the bit line BL results in a voltage between the bit line BL and both the voltage line VL and source line SL.

When writing a 0, the source line SL is discharged to 0 V and the voltage line is charged to 2 V. Accordingly, a voltage with a polarity similar to the voltage when writing a 1 is applied between the voltage line VL and bit line BL while the polarity is reversed for the voltage between the bit line BL and the source line SL.

In an embodiment, the voltage line VL, bit line BL, and source line SL can be precharged to different voltages. For example, in FIG. 14, the voltage line VL is precharged to 0 V while the bit line BL and source line SL are precharged to 1 V. The voltage line VL, bit line BL, and source line SL can be precharged to a different or similar voltages as desired.

Figure 16:
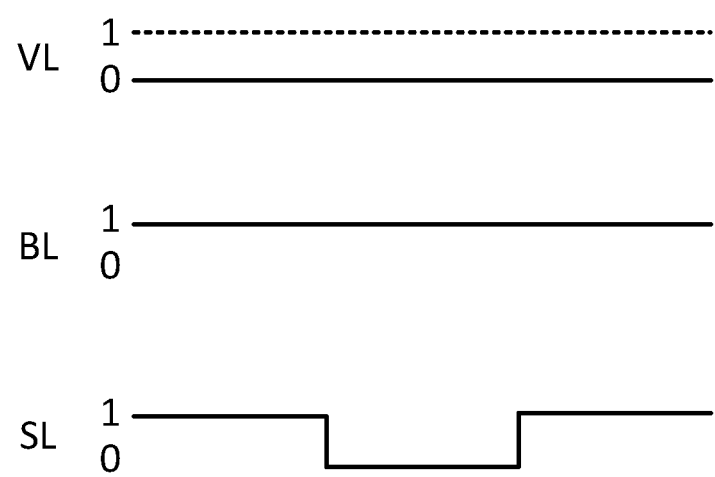
FIG. 16 is a timing diagram illustrating reading from a magnetic element according to an embodiment.

FIG. 16 is a timing diagram illustrating reading from a magnetic element according to an embodiment. The memory cell 500 of FIG. 5 is again used as an example for reference. Referring to FIGS. 5 and 11, in this embodiment, the voltage line VL and bit line are precharged. The voltage line VL is precharged to 0 V and the bit line is precharged to 1 V. The source line SL can be precharged to 1 V.

To read the state of the magnetic element ME, a voltage is applied between the source line SL and the bit line BL. The current through the memory cell can be sensed to detect a state of the magnetic element ME.

As a result of the voltage on the voltage line VL, a negative voltage of −1 V in this embodiment is applied between the voltage line VL and bit line BL in contrast to the positive voltage described above when writing. As a result, instead of the magnetic coercivity decreasing, the magnetic coercivity increases. Thus, a probability of a change in state during a read operation is reduced. Although a negative voltage of −1 V has been described above, the voltage difference between the voltage line VL and the bit line BL can be a different magnitude to achieve a desired amount of increase in the magnetic coercivity.

Although the voltage on the voltage line VL has been described as being less than the voltage on the bit line BL, the voltage on the voltage line VL can be substantially the same as the voltage on the bit line BL. For example, the voltage on the voltage line VL can be 1 V as illustrated by the dashed line.

Although reading and writing have been described above with respect to a magnetic element ME of FIG. 5, such reading and writing can be performed through selection transistors as appropriate. For example, the voltages described above can be applied through the switching device 644 of FIG. 6, the column select transistors 1304 and row selection circuits 1302 of FIG. 13, or the like.

In an embodiment, the voltage line VL, bit line BL, and source line SL can be precharged to substantially the same levels before a read operation as before a write operation. During the corresponding operation, the voltage line VL, bit line BL, and source line SL can be changed, as needed, to different levels.

Figure 17:
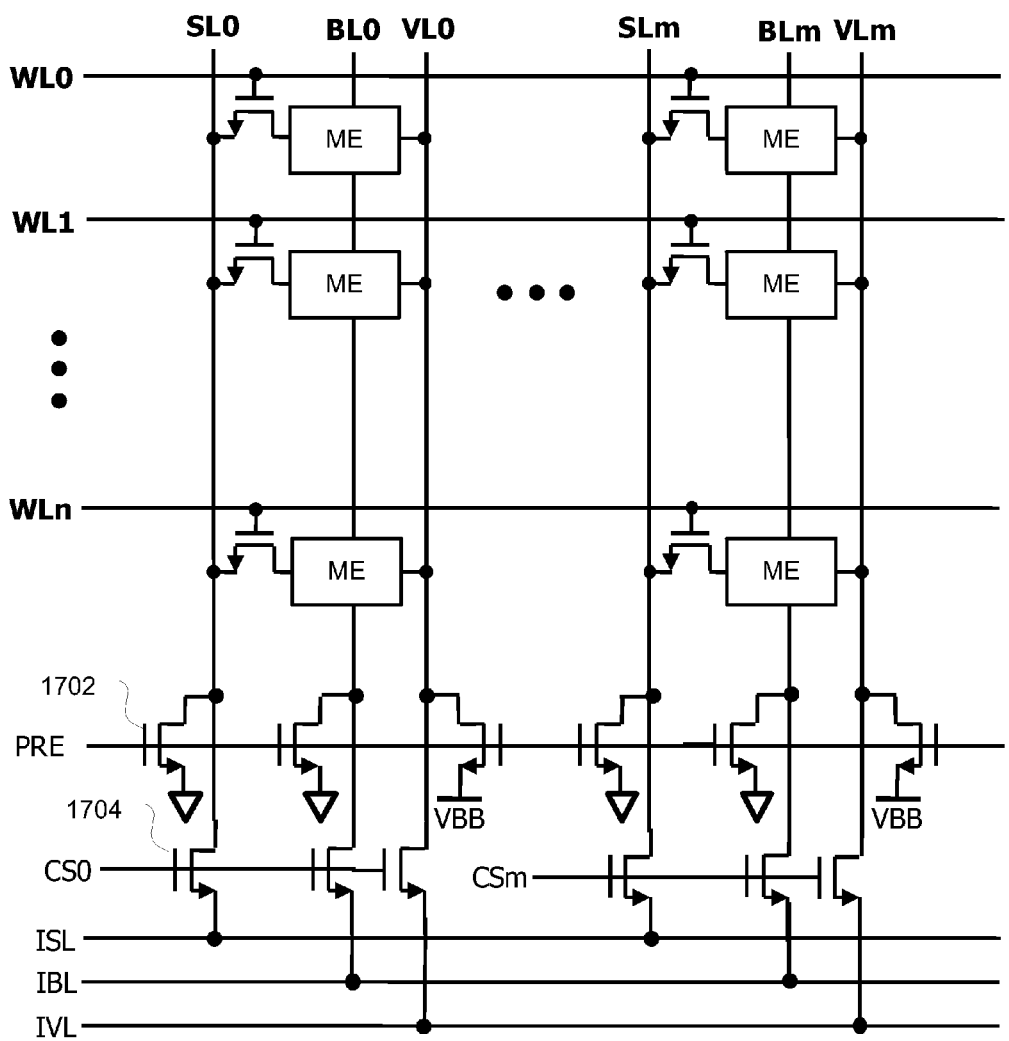
FIGS. 17 and 18 are schematics illustrating a memory cell array and read/write circuitry according to an embodiment.
Figure 18:
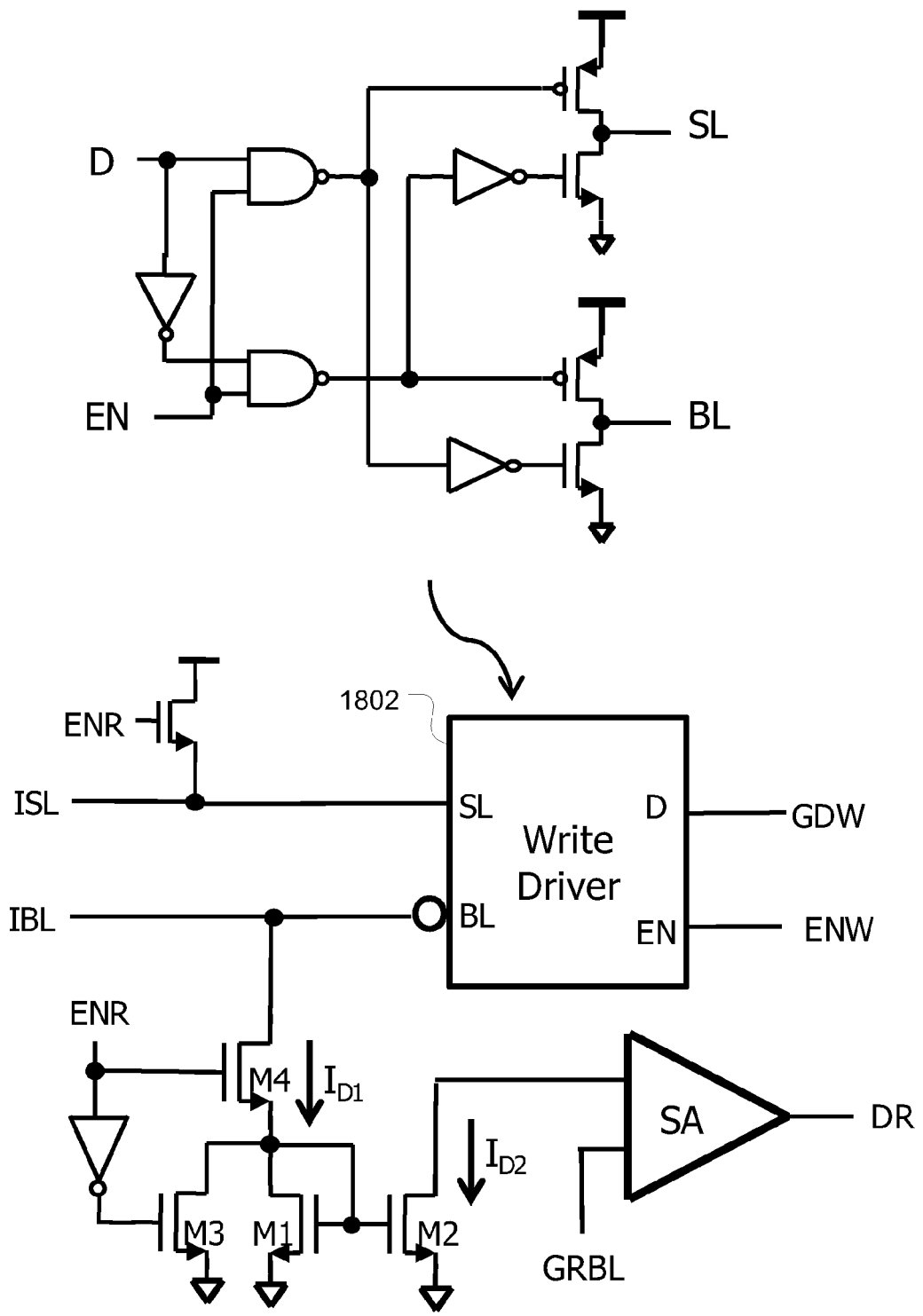

FIGS. 17 and 18 are schematics illustrating a memory cell array and read/write circuitry according to an embodiment. This embodiment is similar to the memory cell array of FIG. 12. Precharge transistors 1702 are coupled to the source lines SL, bit lines BL, and voltage lines VL. The precharge transistors 1702 are responsive to a precharge signal PRE. The precharge signal PRE may be enabled when before and/or after a read/write cycle. For example, in the timing diagrams of FIGS. 14-16, the precharge signal may be enabled before and/or after a time when the appropriate control signals are enabled to generate the desired voltages on the bit line BL, source line SL, voltage line VL, or the like.

As illustrated, when the precharge signal PRE is enabled, the source lines SL and bit lines BL are coupled to ground while the voltage lines VL are coupled to Vbb. However, in other embodiments, the precharge transistors 1702 may be coupled to different voltage sources to achieve the desired precharge level.

Column select transistors 1704 are coupled between the source lines SL and an intermediate source line ISL, between the bit lines BL and an intermediate bit line IBL, and between the voltage lines VL and an intermediate voltage line IVL.

FIG. 18 illustrates read/write circuitry for the memory cell array of FIG. 17 according to an embodiment. A data input D and enable input EN of the write driver 1802 are responsive to a global data write signal GDW and write enable signal ENW. Source line outputs SL and bit line outputs BL are coupled to the intermediate source line ISL and intermediate bit line IBL, respectively.

Figure 19:
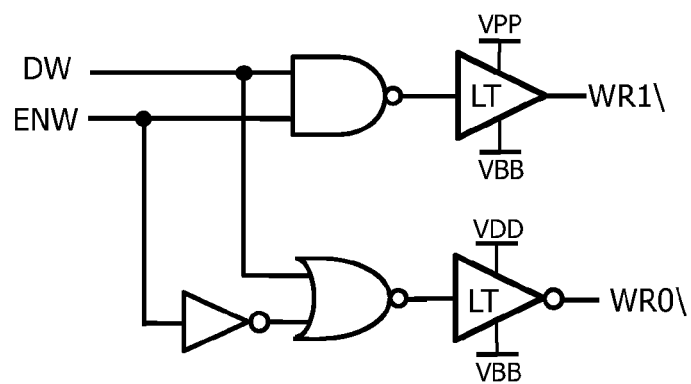
FIGS. 19 and 20 are schematics illustrating voltage line generation circuit according to an embodiment.
Figure 20:
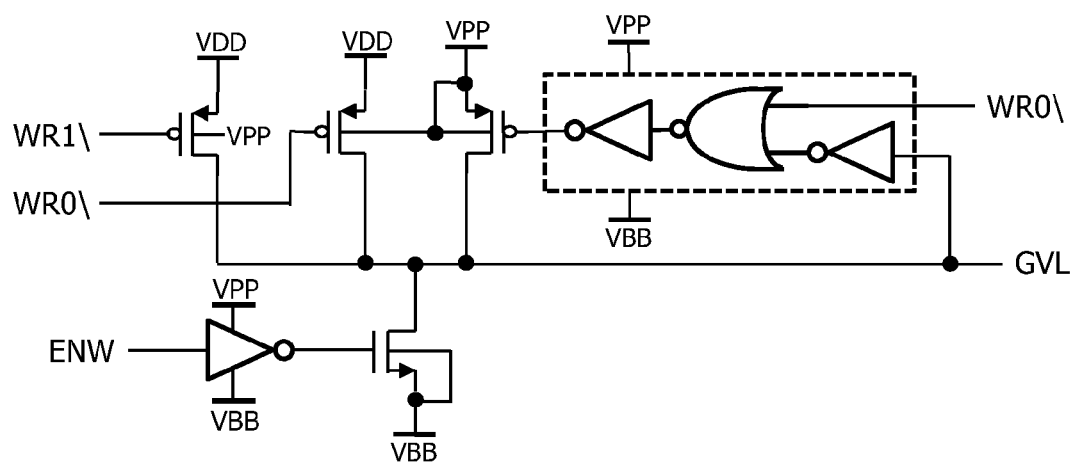

FIGS. 19 and 20 are schematics illustrating voltage line generation circuit according to an embodiment. In FIG. 19, write data DW and write enable ENW are combined to generate write 0 signal WR0\ and write 1 signal WR1\. In FIG. 20, the write signals WR0\ and WR1\ and the write enable ENW are used to generate a global voltage line signal GVL. In particular, during a write operation, if the data to be written is a 0, the global voltage line signal GVL can be pulled to Vdd. If the data to be written is a 1, the global voltage line signal GVL can be pulled to Vpp. During a read operation when the write enable ENW is disabled, the global voltage line signal GVL can be pulled to Vbb.

Although various timing diagrams and circuitry have been described above with respect to a particular memory architecture, in some embodiments the timing of signals and the circuitry can be substantially similar regardless of the memory architecture. For example, the timing diagrams described above can be applied to either or both of the memory architectures illustrated in FIGS. 12, 13, 17, 21, or the like.

Figure 21:
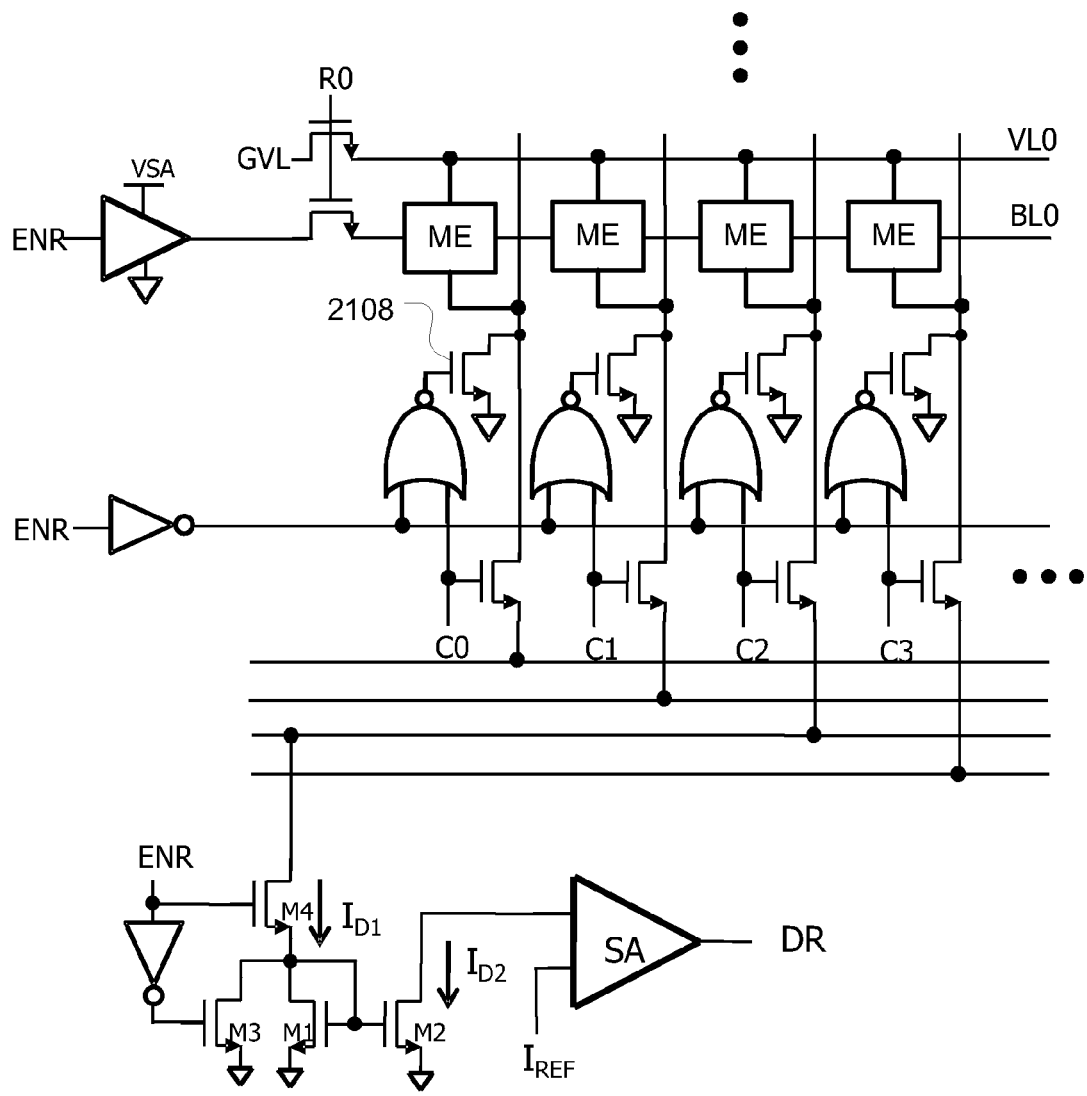
FIGS. 21-23 are schematic illustrating read circuitry according to an embodiment.
Figure 22:
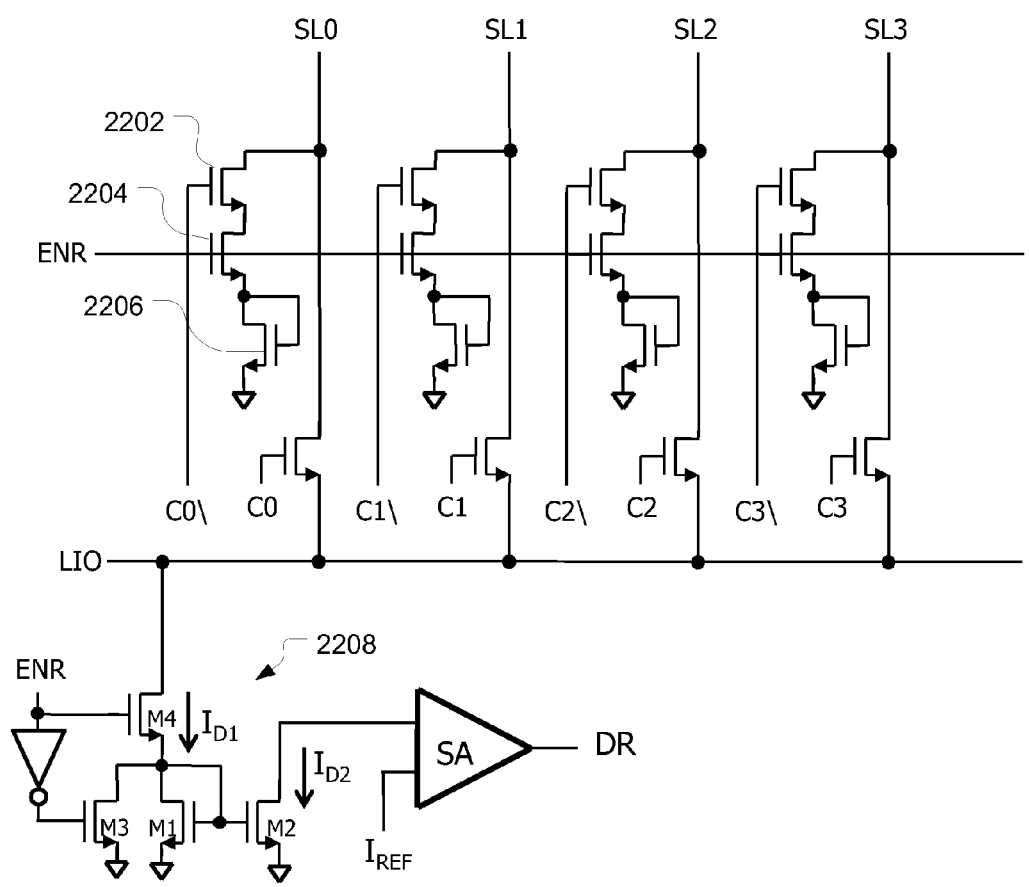

FIGS. 21-22 are schematic illustrating read circuitry according to an embodiment. In FIG. 21, read shunt transistors 2108 are responsive to a read enable signal ENR. If a read operation is not occurring, i.e. the read enable signal ENR is high, the read shunt transistors 2108 are disabled. During a read operation, for read shunt transistors 2108 coupled to unselected columns, i.e. columns with a column select signal Cm that is low, the read shunt transistor 2108 is enabled. Read shunt transistors 2108 coupled to selected columns, i.e. columns with a column select signal Cm that is high, the read shunt transistor 2108 is disabled. For a selected column, such as column C2, the column is coupled to a current mirror and a sense amplifier to generate read data DR. The memory cell array illustrated in FIG. 21 may have precharge transistors similar to precharge transistors 1708 of FIG. 17; however, such elements are omitted for clarity.

Figure 23:
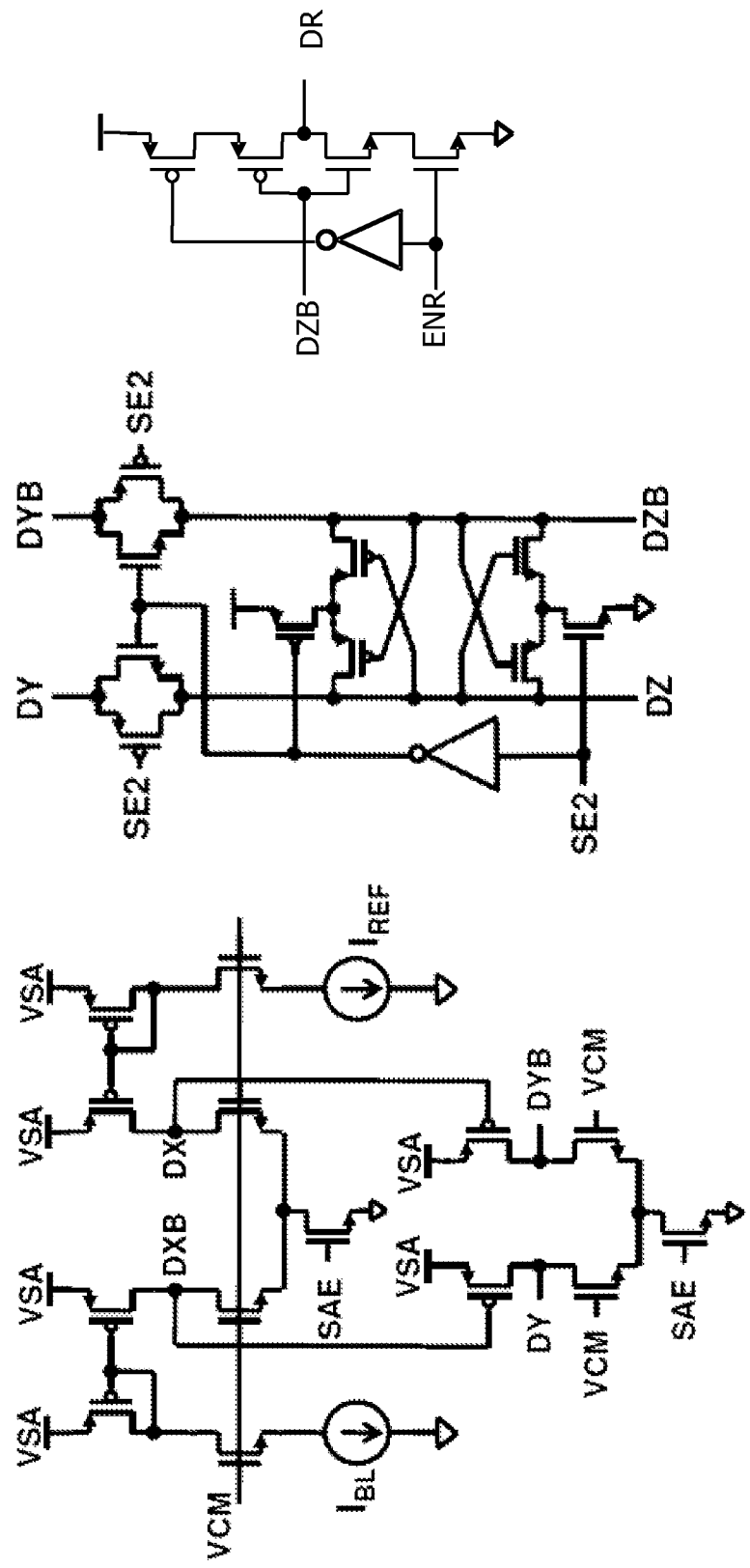
Figure 24:
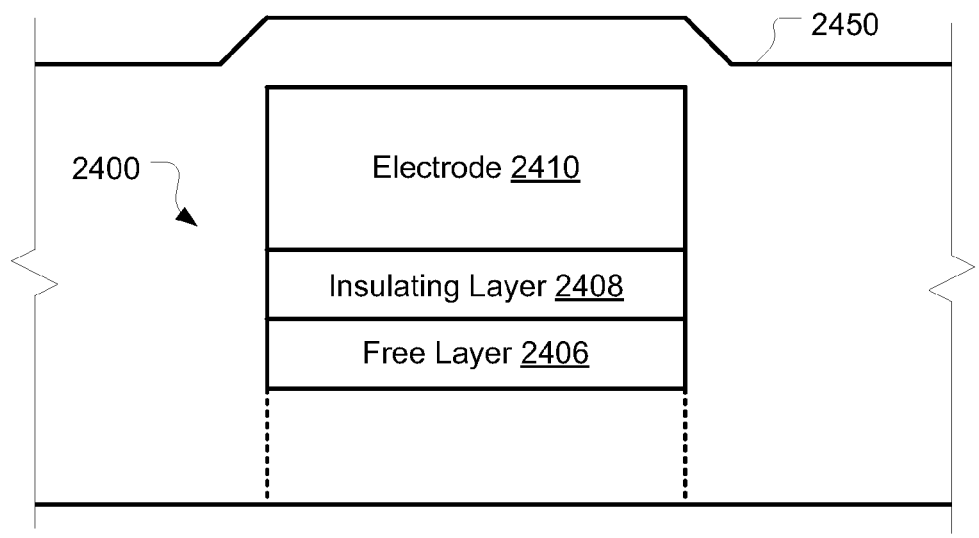
FIGS. 24-27 are schematic views illustrating a technique for forming a connection to a magnetic element according to an embodiment.

FIG. 22 is an example of a circuitry associated with the read shunt transistors. In this embodiment, the transistors 2202, 2204, and 2206 can combine the associated inverted column enable signals C0\ through C3\ with the read enable signal ENR to enable or disable a shunt path as described above. Moreover, the transistors 2202, 2204, and 2206 can form a substantially similar load as the current mirror 2208 for unselected columns. In addition, in this embodiment, a single current mirror 2208 and sense amplifier SA are coupled to multiple columns. Although three columns coupled to the single current mirror 2208 and sense amplifier SA are illustrated, any number of columns can be coupled to the current mirror 2208 and sense amplifier SA. Accordingly, a die area can be reduced as an amount of read circuitry can be reduced. FIG. 23 is an example of a sense amplifier circuit configured to compare an input current $I_{BL}$ to a reference current $I_{REF}$ to generate read data DR.

FIGS. 24-27 are schematic views illustrating a technique for forming a magnetic element according to an embodiment. In this embodiment, in FIG. 24, a free layer 2406, insulating layer 2408, and electrode 2410 of a magnetic element 2400 are formed. For example, the various layers can be deposited, patterned, etched, or the like to form the structure of the magnetic element 2400. For clarity, layers below the free layer 2406 are not illustrated. A fill layer 2450 can be a dielectric layer, such as SiN or an oxide. The fill layer 2450 is deposited over the magnetic element 2400.

Figure 25:
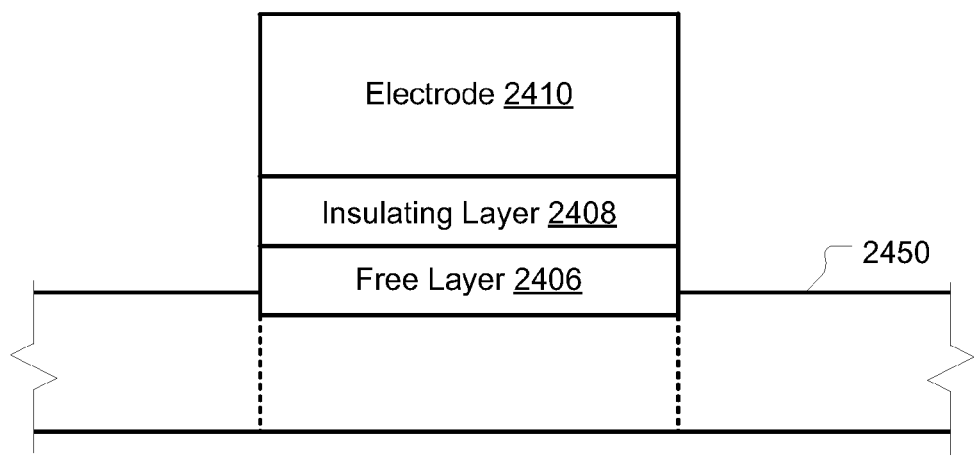

In FIG. 25, the fill layer 2450 is removed to expose the free layer 2406. Although the fill layer 2450 is illustrated as being removed to a level above that of a bottom surface of the free layer 2406, the fill layer 2450 can be removed to a level such that an insulating layer remains between the upper surface of the fill layer 2450 and an underling layer beneath the free layer 2406. Such an insulating layer can be the fill layer 2450, a previously formed insulating layer, or the like.

Figure 26:
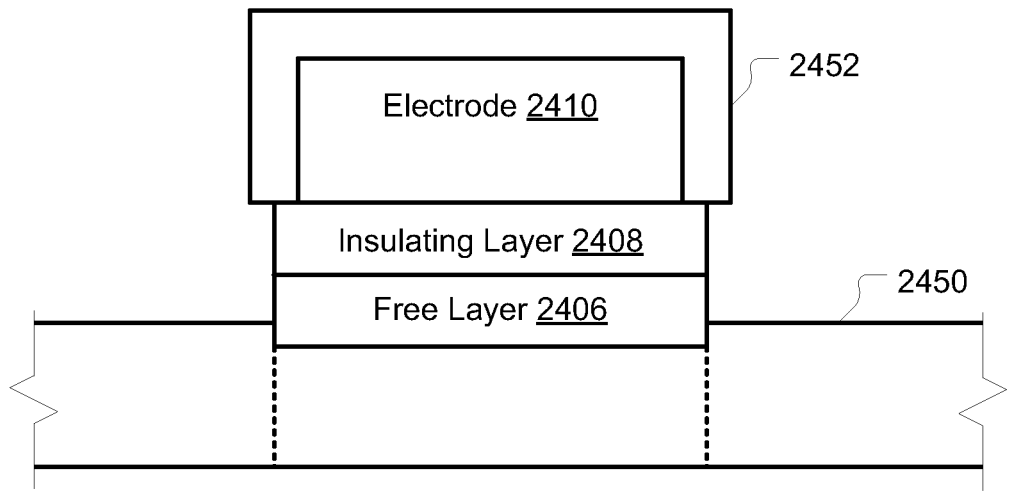
Figure 27:
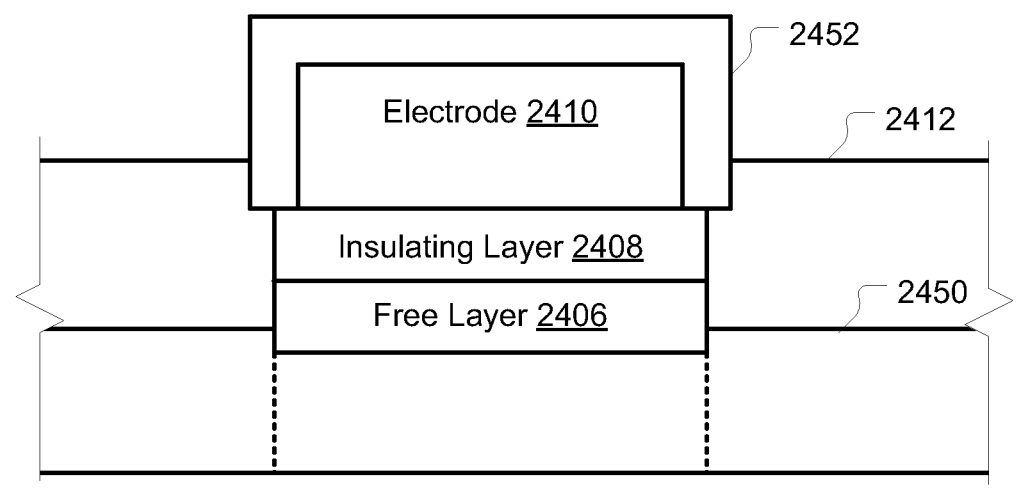
Figure 28:
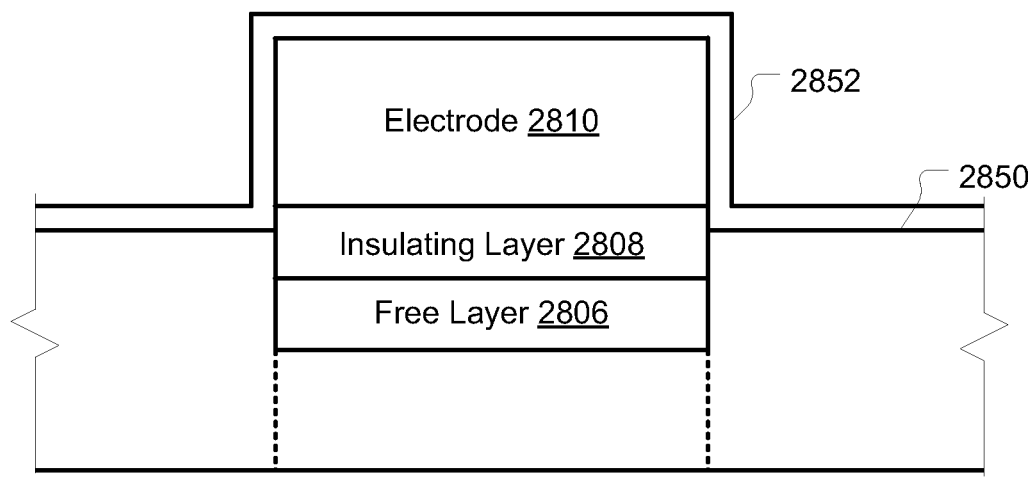
FIGS. 28-31 are schematic views illustrating a technique for forming a connection to a magnetic element according to an embodiment.

In FIG. 26, the electrode 2410 is oxidized, forming an oxide capping layer 2452. The oxidization can be performed by plasma oxidation, thermal oxidation, or the like. Although the free layer 2406 is also exposed, the free layer 2406 can be relatively inert with respect to the oxidization. For example, the materials and process parameters can be selected such that the electrode 2410 oxidizes a sufficient amount while the free layer 2406 does not substantially oxidize.

In another embodiment, the free layer 2406 can be protected from oxidization by the fill layer 2450 or another layer. The layer or layers can be removed such that the fill layer 2450 exposes the free layer 2406.

In FIG. 25, after oxidization, a second electrode 2412 can be formed on the fill layer 2450. The second electrode 2412 is coupled to the free layer 2406. In particular, the second electrode 2412 is coupled to sidewalls of the free layer 2406. Although the second electrode 2412 is described as being coupled to the sidewalls of the free layer 2406, as described above, the first electrode 2410 and insulating layer 2408 can be formed such that a top surface of the free layer 2406 is also exposed. Thus, the second electrode 2412 can also contact the top surface of the free layer 2406. The first electrode 2410 and the second electrode 2412 are separated by the oxide layer 2452. That is, even though the second electrode 2412 contacts what was the first electrode 2410 before oxidization, the oxide capping layer 2452 formed on the first electrode 2412 insulates the remaining first electrode 2412 from the second electrode 2412. Accordingly, a voltage difference can be applied between the first electrode 2410 and second electrode 2412 to create an electric field in the free layer 2406 as described above.

FIGS. 28-31 are schematic views illustrating a technique for forming a connection to a magnetic element according to an embodiment. In this embodiment, the free layer 2806, insulating layer 2808, electrode 2810, and fill layer 2850 are similar to the free layer 2406, insulating layer 2408, electrode 2410, and fill layer 2450 described above. The corresponding structure can be formed similar to that described with respect to FIG. 24.

However, in this embodiment, the fill layer 2850 is removed to a level below an upper surface of the insulating layer 2808. An insulating layer 2852, such as an oxide layer, is formed over the electrode 2810, extending to at least the fill layer 2850. In this embodiment, the insulating layer 2852 extends across the fill layer 2850; however, in another embodiment, the insulating layer 2852 can extend to the fill layer 2850. In another embodiment, the insulating layer 2852 may be formed using a deposition process such as an atomic layer deposition (ALD) process.

Figure 29:
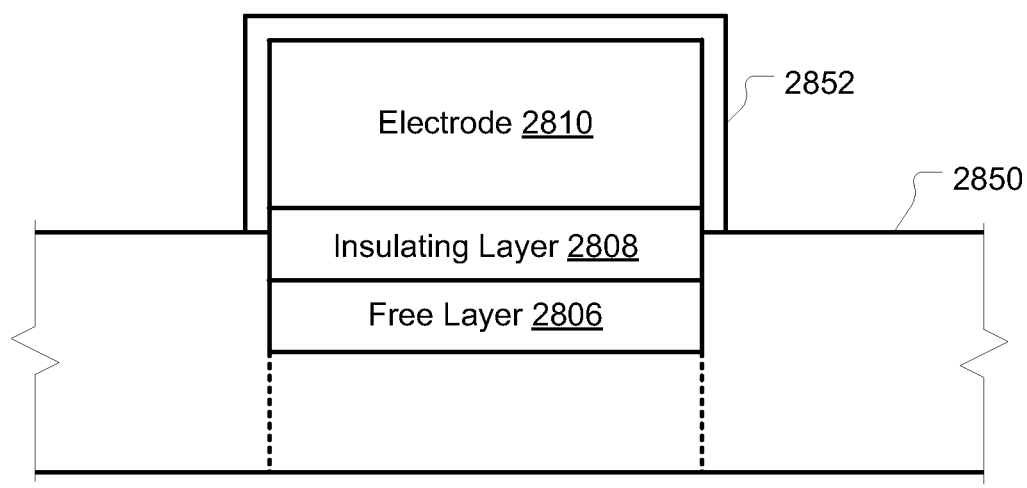

In FIG. 29, the insulating layer 2852 is anisotropically etched. For example, the insulating layer 2852 can be etched by, for example, reactive ion etching. As a result, portions of the insulating layer 2852 extending across the fill layer 2850 are removed, exposing the fill layer 2850. However, portions of the insulating layer 2852 remain at least on the electrode 2810. In particular, portions of the insulating layer 2852 remain on the sidewalls of the electrode 2810. Although the insulating layer 2852 is illustrated as remaining on a top surface of the electrode 2810, such a portion can also be removed by the anisotropic etching.

Figure 30:
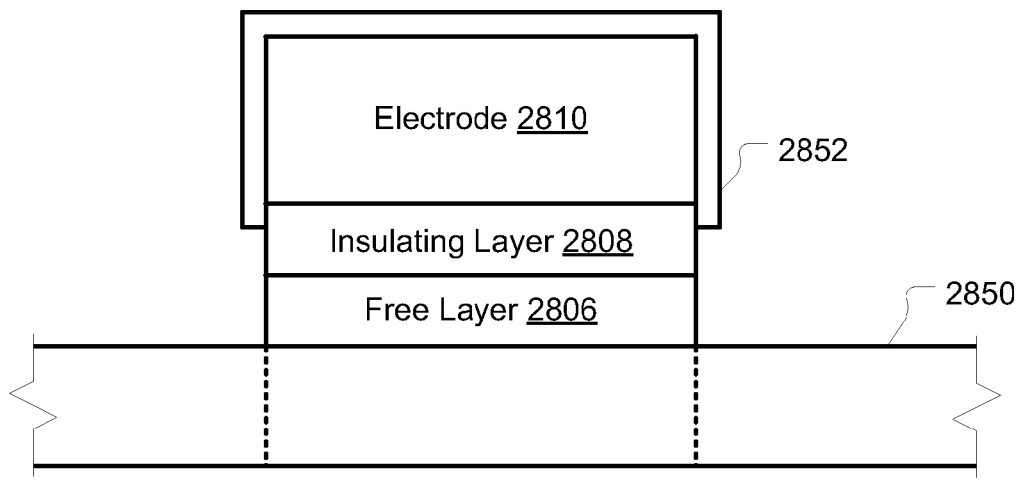

In FIG. 30, at least a part of the fill layer 2850 is removed to expose the free layer 2806 after anisotropically etching the second insulating layer 2852. Accordingly, the fill layer 2850 that was disposed on the sidewalls of the free layer 2806 is removed, exposing sidewalls of the free layer 2806.

Figure 31:
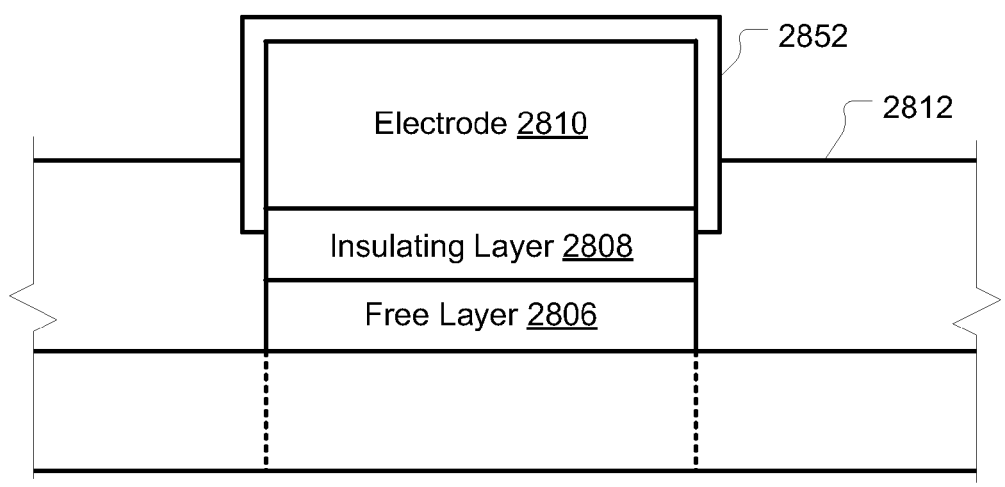

In FIG. 31, a second electrode 2812 is formed coupled to the free layer 2806. In particular, the second electrode 2812 can form an electrical connection to the free layer 2806. However, the insulating layer 2852 is disposed between the first electrode 2810 and the second electrode 2812. Thus, as described above, a voltage can be applied between the first electrode 2810 and the second electrode 2812 such that an electric field is created in the free layer 2806.

In an embodiment, once the second electrode, such as the second electrode 2412 of FIG. 25 or the second electrode 2812 of FIG. 31, is formed, subsequent processing can be performed to make connections to the corresponding first electrode 2410 or 2810. For example, subsequent filling, patterning, etching, polishing, or the like can be performed to make such connections.

As described above, an insulating layer such as insulating layers 2452 and 2852 can be formed on side surfaces of the first electrodes 2410 and 2810, respectively. Thus, when a second electrode 2412 or 2812 is formed, the second electrode 2412 or 2812 is insulated from the corresponding electrodes 2410 and 2810. Although oxidization and patterning of a deposited layer have been used as examples, the formation of the insulating layer between the first and second electrodes can be formed using other processes such that the first electrode is insulated from the second electrode.

Figure 32:
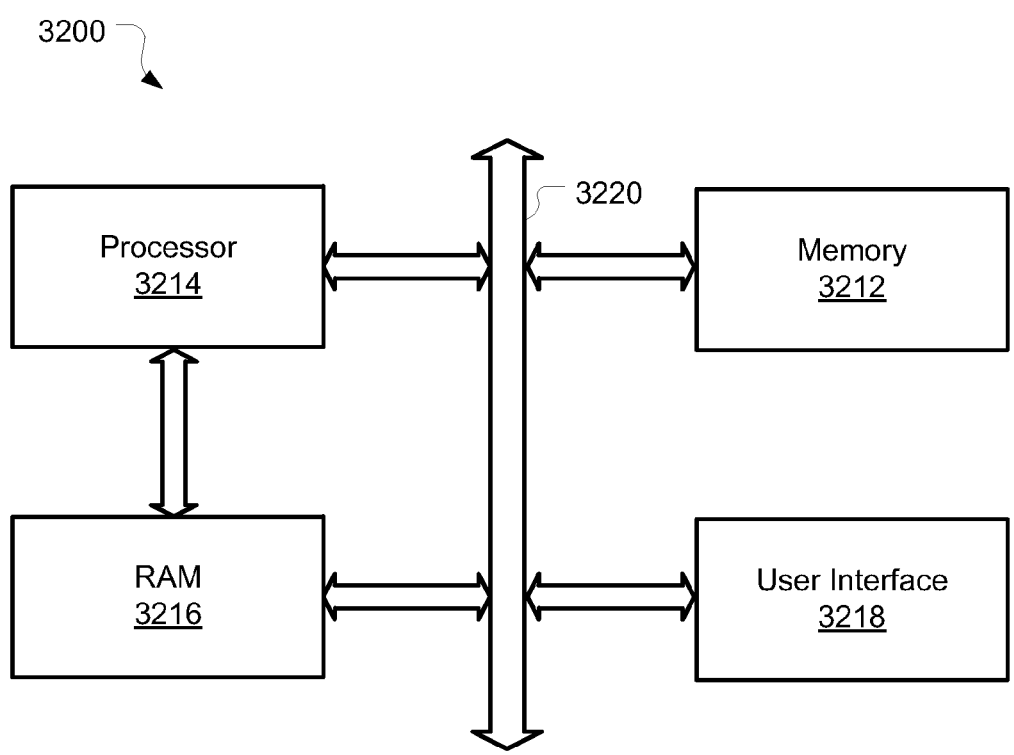
FIG. 32 is a schematic view of an electronic system in which the magnetic element can be used according to an embodiment.

FIG. 32 is a schematic view of an electronic system in which the magnetic element can be used according to an embodiment. The electronic system 3200 may be used for a wide variety of electronic devices such as a computer including, but not limited to, a portable notebook computer, Ultra-Mobile PCs (UMPC), Tablet PCs, a server, workstation, a mobile telecommunication device, satellite, set top box, TV and so on. For example, the electronic system 3200 may include a memory system 3212, a processor 3214, RAM 3216, and a user interface 3218, which may execute data communication using a bus 3220. The memory system 3212 may include magnetic elements, memory cells, memory arrays, or the like as described above.

The processor 3214 may be a microprocessor or a mobile processor (AP). The processor 3214 may have a processor core (not illustrated) that can include a floating point unit (FPU), an arithmetic logic unit (ALU), a graphics processing unit (GPU), and a digital signal processing core (DSP Core), or any combinations thereof. The processor 3214 may execute the program and control the electronic system 3200.

The RAM 3216 may be used as an operation memory of the processor 3214. For example, the processor 3214 or the RAM 3216 may include a magnetic element according to example embodiments described above. Alternatively, the processor 3214 and the RAM 3216 may be packaged in a single package body.

The user interface 3218 may be used in inputting/outputting data to/from the electronic system 3200. The memory system 3212 may store codes for operating the processor 3214, data processed by the processor 3214, or externally input data. The memory system 3212 may include a controller and a memory.

Reference throughout this specification to "one embodiment" or "an embodiment" means that a particular feature, structure, or characteristic described in connection with the embodiment is included in at least one embodiment of the present invention.

Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various magnetic element structures, memory cells, and methods and systems for providing a magnetic element and memory cells fabricated using the magnetic element have been described.

Although the structures, methods, and systems have been described in accordance with exemplary embodiments, one of ordinary skill in the art will readily recognize that many variations to the disclosed embodiments are possible, and any variations should therefore be considered to be within the spirit and scope of the apparatus, method, and system disclosed herein. Accordingly, many modifications may be made by one of ordinary skill in the art without departing from the spirit and scope of the appended claims.

The invention claimed is:

1. A magnetic element for a semiconductor device, comprising:
 a reference layer;
 a free layer;
 a barrier layer disposed between the reference layer and the free layer;
 a first electrode;
 an insulating layer disposed between the first electrode and the free layer; and
 a second electrode coupled to sidewalls of the free layer.

2. The magnetic element of claim 1, wherein:
 the second electrode includes an opening; and
 the insulating layer is disposed in the opening.

3. The magnetic element of claim 1, wherein the insulating layer is an oxide layer.

4. The magnetic element of claim 1, further comprising a second insulating layer disposed on sidewalls of the first electrode and exposing at least a part of the free layer.

5. The magnetic element of claim 4, wherein the second insulating layer is disposed on a top surface of the free layer and exposes sidewalls of the free layer.

6. The magnetic element of claim 4, wherein:
 a portion of a top surface of the free layer is exposed; and
 the second electrode contacts the portion of the top surface of the free layer.

7. The magnetic element of claim 1, wherein the second electrode is a bit line.

8. The magnetic element of claim 1, further comprising a third electrode coupled to the reference layer.

9. A memory cell for a semiconductor device, comprising:
a magnetic element including:
a free layer;
a first electrode coupled to sidewalls of the free layer;
a second electrode; and
a third electrode where the first electrode is substantially insulated from the third electrode;
a bit line coupled to the first electrode;
a source line coupled to the second electrode; and
a voltage line coupled to the third electrode.

10. The memory cell of claim 9, wherein the bit line is the first electrode.

11. The memory cell of claim 9, further comprising a switching device coupled between the source line and the second electrode.

12. The memory cell of claim 11, further comprising a word line coupled to the switching device.

13. The memory cell of claim 9, further comprising:
a column select transistor coupled to the source line; and
a column read shunt transistor coupled between the source line and a voltage source.

14. The memory cell of claim 9, further comprising:
a global voltage line;
a global bit line; and
a row selection circuit coupled between the global voltage line and the voltage line, and between the global bit line and the bit line;
wherein the row selection circuit is configured to selectively couple the global voltage line to the voltage line, and selectively couple the global bit line to the bit line in response to a row selection signal.

15. A method of writing data to a semiconductor device, comprising:
applying a voltage between a voltage line and a bit line of a magnetic memory cell;
applying a voltage between a source line of the magnetic memory cell and the bit line; and
precharging the voltage line, the bit line, and the source line to corresponding precharge voltages.

16. The method of claim 15, further comprising discharging the bit line.

17. The method of claim 15, further comprising:
discharging the source line; and
charging the voltage line.

18. A method of writing data to a semiconductor device, comprising:
applying a voltage between a voltage line and a bit line of a magnetic memory cell;
applying a voltage between a source line of the magnetic memory cell and the bit line;
when the data to be written is a first state, charging the voltage line to a first level; and
when the data to be written is a second state, charging the voltage line to a second level;
wherein the first level and second level are different.

19. The method of claim 15, wherein the voltage applied between the voltage line and the bit line is opposite in polarity to a voltage applied between the voltage line and the bit line during a read operation.

20. A method of reading data from a semiconductor device, comprising:
precharging a voltage line and a bit line associated with a memory cell to corresponding precharge voltages;
applying a voltage between a source line associated with the memory cell and the bit line; and
sensing a current through the memory cell.

21. The method of claim 20, wherein precharging the voltage line comprises precharging the voltage line to a precharge voltage less than the precharge voltage of the bit line.

22. The method of claim 21, wherein a voltage difference between the voltage line and the bit line is opposite in polarity to a voltage difference between the voltage line and the bit line during a write operation.

23. The method of claim 20, wherein precharging the voltage line and the bit line comprises precharging the voltage line and the bit line to substantially the same voltage.

24. The method of claim 20, further comprising coupling unselected source lines to a voltage potential when sensing the current through the memory cell.

25. A method, comprising:
sequentially forming a magnetic element including a free layer, a first insulating layer, and a first electrode;
forming a second insulating layer on side surfaces of the first electrode; and
forming a second electrode coupled to the free layer after forming the second insulating layer on the side surfaces of the first electrode.

26. The method of claim 25, wherein forming the second insulating layer comprises oxidizing the side surfaces of the first electrode.

27. The method of claim 25, wherein forming the insulating layer comprises performing an atomic layer deposition process on the side surfaces of the first electrode.

28. The method of claim 25, wherein forming the second electrode comprises depositing the second electrode in contact with the second insulating layer on the side surfaces of the first electrode.

29. The method of claim 25, further comprising depositing a fill layer over the free layer, the first insulating layer, and the first electrode.

30. The method of claim 29, further comprising removing the fill layer to expose at least a part of the free layer.

31. The method of claim 25, wherein forming the second insulating layer comprises depositing the second insulating layer extending over the first electrode to at least the first insulating layer.

32. The method of claim 31, further comprising:
forming a fill layer to a level below a top surface of the first insulating layer;
wherein depositing the second insulating layer comprises depositing the second insulating layer over the fill layer.

33. The method of claim 31, further comprising anisotropically etching the second insulating layer.

34. The method of claim 33, further comprising exposing the free layer after anisotropically etching the second insulating layer.

35. A magnetic element for a semiconductor device, comprising:
a reference layer;
a free layer;
a barrier layer disposed between the reference layer and the free layer;
an insulating layer disposed on the free layer;
a first electrode disposed on the insulating layer; and
a second electrode coupled to sidewalls of the free layer.

36. The magnetic element of claim 35, wherein the second electrode is a bit line for a plurality of magnetic elements.

* * * * *